(12) United States Patent
Jeon et al.

(10) Patent No.: US 11,382,213 B2
(45) Date of Patent: Jul. 5, 2022

(54) PRINTED CIRCUIT BOARD

(71) Applicant: SAMSUNG ELECTRO-MECHANICS CO., LTD., Suwon-si (KR)

(72) Inventors: Kee Su Jeon, Suwon-si (KR); Sang Hoon Kim, Suwon-si (KR); Yong Duk Lee, Suwon-si (KR); Min Jae Seong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/169,779

(22) Filed: Feb. 8, 2021

(65) Prior Publication Data

US 2022/0141953 A1 May 5, 2022

(30) Foreign Application Priority Data

Oct. 30, 2020 (KR) ........................ 10-2020-0143667

(51) Int. Cl.
| | |
|---|---|
| *H05K 1/02* | (2006.01) |
| *H05K 1/03* | (2006.01) |
| *H05K 1/11* | (2006.01) |
| *H05K 1/18* | (2006.01) |

(52) U.S. Cl.
CPC ......... *H05K 1/0298* (2013.01); *H05K 1/0366* (2013.01); *H05K 1/0373* (2013.01); *H05K 1/111* (2013.01); *H05K 1/115* (2013.01); *H05K 1/18* (2013.01); *H05K 2201/096* (2013.01)

(58) Field of Classification Search
CPC .. H05K 1/0298; H05K 1/0366; H05K 1/0373; H05K 1/115; H05K 2201/096
See application file for complete search history.

(56) References Cited

U.S. PATENT DOCUMENTS 10,566,257 B2 * 2/2020 Kurahashi ........... H01L 21/6835
2006/0273816 A1 * 12/2006 Hsu ...................... H05K 3/4602
174/255

(Continued)

FOREIGN PATENT DOCUMENTS

| JP | 2004-140134 A | 5/2004 |
|---|---|---|
| JP | 2010-141204 A | 6/2010 |

(Continued)

*Primary Examiner* — Ishwarbhai B Patel
(74) *Attorney, Agent, or Firm* — Morgan, Lewis & Bockius LLP

(57) ABSTRACT

A printed circuit board includes: a first insulating layer; a first wiring layer at least partially buried in the first insulating layer; a second insulating layer disposed on an upper surface of the first insulating layer; a second wiring layer at least partially buried in the second insulating layer; and a cavity penetrating through the second insulating layer and a portion of the first insulating layer and exposing a portion of the upper surface of the first insulating layer as a bottom surface of the cavity. The first wiring layer includes a wiring pattern at least partially exposed from the first insulating layer by the cavity, an upper surface of the wiring pattern has a step structure with the upper surface of the first insulating layer exposed by the cavity, and a lower surface of the wiring pattern is coplanar with a lower surface of the first insulating layer.

22 Claims, 26 Drawing Sheets

(56) References Cited

U.S. PATENT DOCUMENTS

| | | | |
|---|---|---|---|
| 2008/0049405 A1* | 2/2008 | Sahara | H05K 1/0306 |
| | | | 361/761 |
| 2010/0147560 A1 | 6/2010 | Kaneko | |
| 2016/0120033 A1* | 4/2016 | Furusawa | H01L 23/49827 |
| | | | 174/251 |
| 2017/0064825 A1* | 3/2017 | Ishihara | H05K 1/113 |

FOREIGN PATENT DOCUMENTS

| | | |
|---|---|---|
| JP | 6037514 B2 | 12/2016 |
| KR | 10-2017-0059536 A | 5/2017 |

* cited by examiner

PRINTED CIRCUIT BOARD

CROSS-REFERENCE TO RELATED APPLICATION(S)

This application claims benefit of priority to Korean Patent Application No. 10-2020-0143667 filed on Oct. 30, 2020 in the Korean Intellectual Property Office, the disclosure of which is incorporated herein by reference in its entirety.

TECHNICAL FIELD

The present disclosure relates to a printed circuit board.

BACKGROUND

Electronic devices in the information technology (IT) field, including mobile phones, have become light, thin, compact, and small. In this regard, there is technical demand for inserting an electronic component, such as an integrated circuit (IC), into a printed circuit board. Recently, technologies for embedding such an electronic component into a printed circuit board in various manners have been developed. Accordingly, various cavity structures are formed in a printed circuit board.

SUMMARY

An aspect of the present disclosure may provide a printed circuit board having a cavity structure such that the printed circuit board may be thin even when an electronic component is mounted thereon.

Another aspect of the present disclosure may provide a printed circuit board having a wiring pattern exposed by a cavity for an electronic component to be effectively mounted on the printed circuit board.

Another aspect of the present disclosure may provide a printed circuit board capable of preventing a delamination defect of a wiring pattern exposed by a cavity.

One of several solutions suggested through the present disclosure may be to provide a printed circuit board in which a cavity is formed to penetrate through a portion of an insulating layer using a blast processing technique or a plasma processing technique such that a portion of an upper surface of the insulating layer may serve as a bottom surface of the cavity, and at least a portion of the wiring pattern exposed by the cavity is buried in the insulating layer.

According to an aspect of the present disclosure, a printed circuit board may include: a first insulating layer; a first wiring layer at least partially buried in the first insulating layer; a second insulating layer disposed on an upper surface of the first insulating layer; a second wiring layer at least partially buried in the second insulating layer; and a cavity penetrating through the second insulating layer and a portion of the first insulating layer and exposing a portion of the upper surface of the first insulating layer as a bottom surface of the cavity. The first wiring layer may include a wiring pattern at least partially exposed from the first insulating layer by the cavity, an upper surface of the wiring pattern may have a step structure with the upper surface of the first insulating layer exposed by the cavity, and a lower surface of the wiring pattern may be coplanar with a lower surface of the first insulating layer.

According to another aspect of the present disclosure, a printed circuit board may include: a first insulating layer; a second insulating layer disposed on an upper surface of the first insulating layer; a first cavity penetrating through a portion of the second insulating layer and having a portion of an upper surface of the second insulating layer as a bottom surface of the first cavity; a second cavity penetrating through the second insulating layer and a portion of the first insulating layer and having a portion of the upper surface of the first insulating layer as a bottom surface of the second cavity; a first wiring layer buried in a lower portion of the first insulating layer and at least partially exposed from the first insulating layer by the second cavity; and a second wiring layer buried in a lower portion of the second insulating layer and at least partially exposed from the second insulating layer by the first cavity. The second cavity may be deeper than the first cavity.

According to another aspect of the present disclosure, a printed circuit board may include: a first insulating layer; a first wiring layer at least partially buried in the first insulating layer; a second insulating layer disposed on an upper surface of the first insulating layer; a second wiring layer at least partially buried in the second insulating layer; a via disposed in the first insulating layer and connecting the first wiring layer and the second wiring layer to each other; and a cavity penetrating through the second insulating layer and a portion of the first insulating layer and exposing a portion of the upper surface of the first insulating layer as a bottom surface of the cavity. The first wiring layer may include a wiring pattern at least partially exposed from the first insulating layer by the cavity, an upper surface of the wiring pattern may have a step structure with the upper surface of the first insulating layer exposed by the cavity, and a width of the via may increase in a direction from the first wiring layer to the second wiring layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

In the present disclosure, the expression "side portion", "side surface", or the like is used to refer to a left or right direction or a surface in that direction based on the drawings for convenience, the expression "upper side", "upper portion", "upper surface", or the like is used to refer to an upward direction or a surface in that direction based on the drawings for convenience, and the expression "lower side", "lower portion", "lower surface", or the like is used to refer to a downward direction or a surface in that direction based on the drawings for convenience. In addition, the expression "positioned on the side portion, the upper side, the upper portion, the lower side, or the lower portion" conceptually includes a case in which a target component is positioned in a corresponding direction but is not in direct contact with a reference component, as well as a case in which the target component is in direct contact with the reference component in the corresponding direction. However, these directions are defined for convenience of explanation, and the claims are not particularly limited by the directions defined above, and the concepts of the upper and lower portions, sides and surfaces may be changed.

Figure 1:
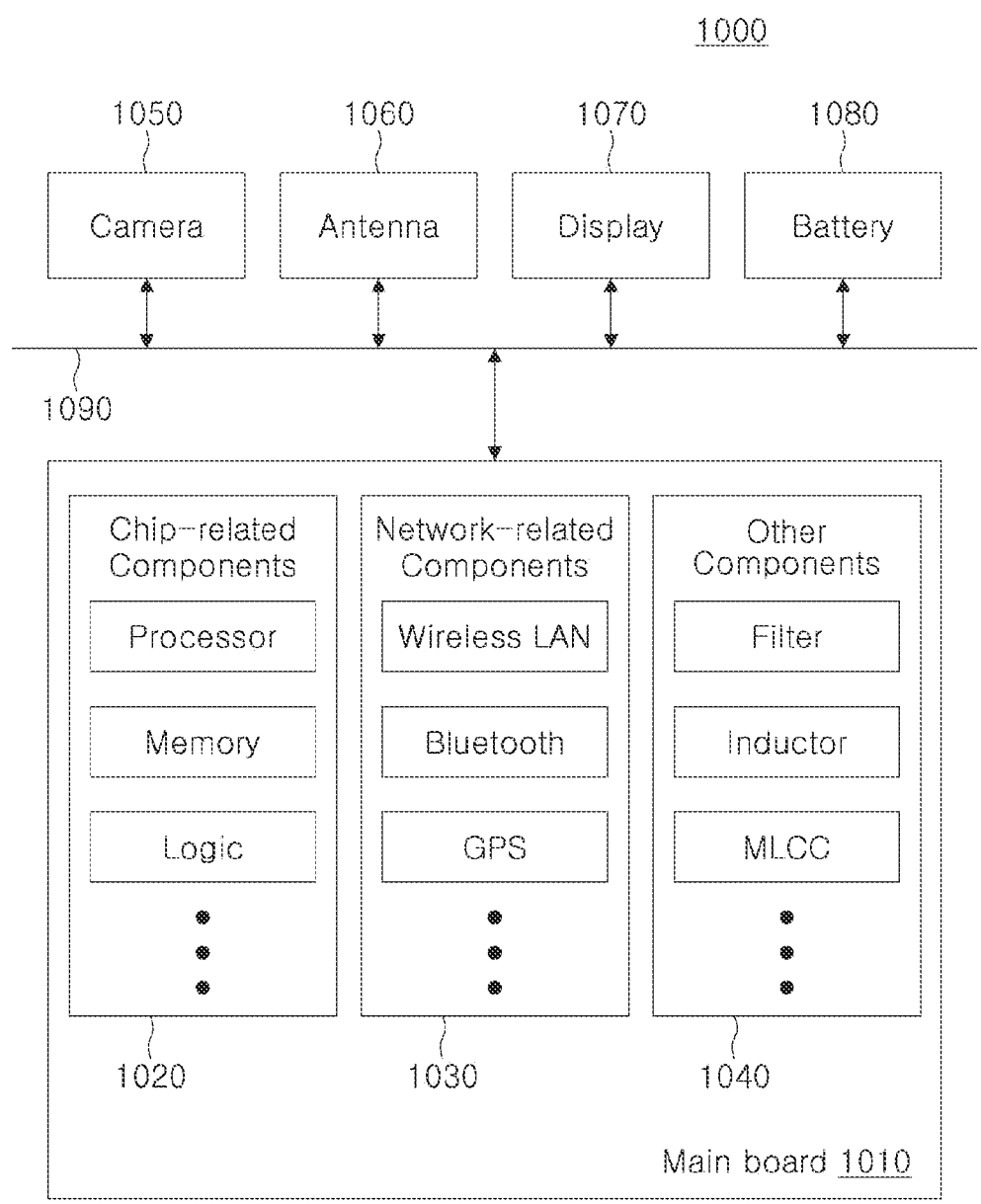
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010 therein. Chip-related components 1020, network-related components 1030, and other components 1040 may be physically and/or electrically connected to the main board 1010. These components may also be coupled to other electronic components, which will be described later, to form various signal lines 1090.

The chip-related components 1020 may include: a memory chip such as a volatile memory (e.g. a dynamic random access memory (DRAM)), a non-volatile memory (e.g. a read only memory (ROM)), or a flash memory; an application processor chip such as a central processor (e.g. a central processing unit (CPU)), a graphics processor (e.g. a graphics processing unit (GPU)), a digital signal processor, a cryptography processor, a microprocessor, or a microcontroller; and a logic chip such as an analog-to-digital converter or an application-specific integrated circuit (ASIC). However, the chip-related components 1020 are not limited thereto, and may include any other types of chip-related components. Also, these chip-related components may also be combined with each other. The chip-related component may be in the form of a package including the above-described chip.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access +(HSPA+), high speed downlink packet access+ (HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G, and any other wireless and wired protocols designated thereafter. However, the network-related components 1030 are not limited thereto, and may include any other wireless or wired standards or protocols. Also, the network-related component 1030 may be provided in the form of a package in combination with the chip-related component 1020.

The other components 1040 may include a high-frequency inductor, a ferrite inductor, a power inductor, ferrite beads, low-temperature co-firing ceramics (LTCC), an electro-magnetic interference (EMI) filter, a multi-layer ceramic condenser (MLCC), and the like. However, the other components 1040 are not limited thereto, and may include passive elements in the form of chip components used for various other purposes. Also, the other component 1040 may be provided in the form of a package in combination with the chip-related component 1020 and/or the network-related component 1030.

The electronic device 1000 may include any other electronic components that may be or may not be physically and/or electrically connected to the main board 1010 according to the type of electronic device 1000. Examples of the other electronic components may include a camera 1050, an antenna 1060, a display 1070, and a battery 1080. However, the other electronic components are not limited thereto, and may be an audio codec, a video codec, a power amplifier, a compass, an accelerometer, a gyroscope, a speaker, a mass storage device (e.g. a hard disk drive), a compact disc (CD), and a digital versatile disc (DVD). Also, the electronic device 1000 may include any other electronic components used for various purposes according to the type of electronic device 1000.

The electronic device 1000 may be a smartphone, a personal digital assistant, a digital video camera, a digital still camera, a network system, a computer, a monitor, a tablet, a laptop, a netbook, a television, a video game machine, a smart watch, or an automotive component. However, the electronic device 1000 is not limited thereto, and may be any other electronic device processing data.

Figure 2:
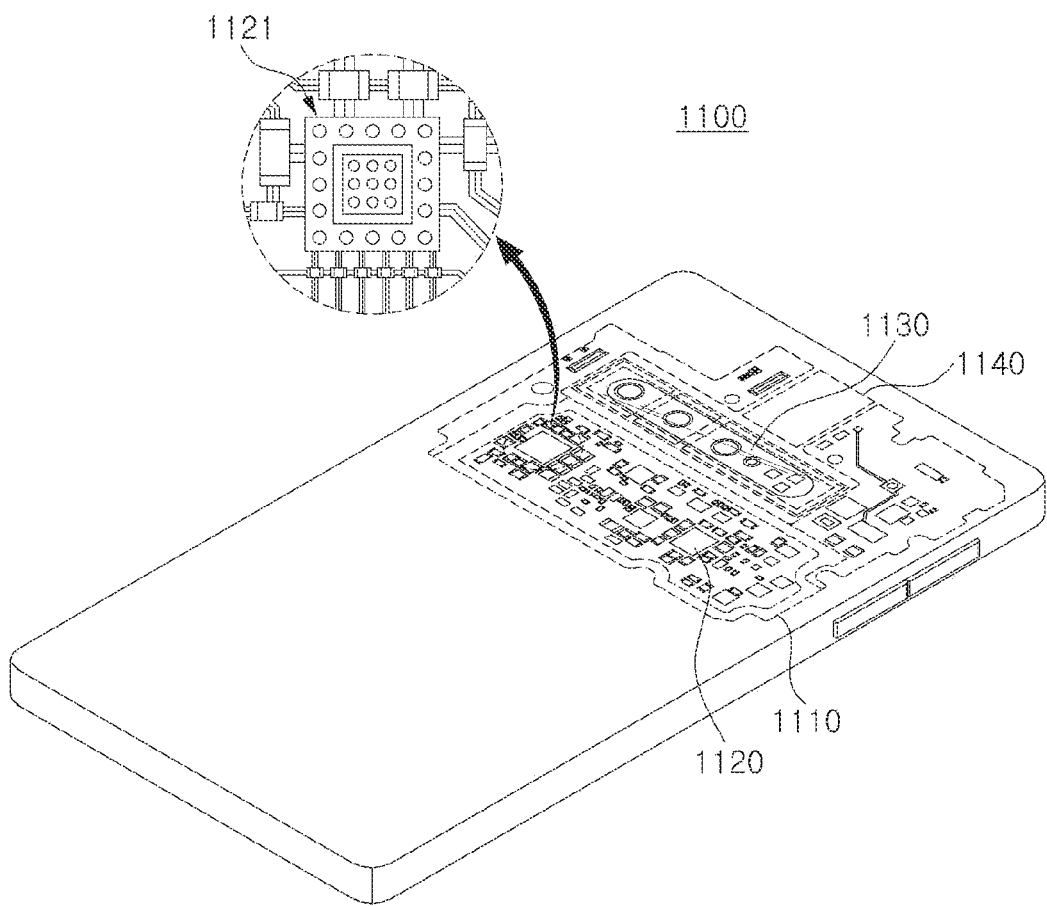
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. A mother board 1110 may be accommodated in the smartphone 1100, and various electronic components 1120 may be physically and/or electrically connected to the motherboard 1110. Also, a camera 1130 and/or a speaker 1140 and the like may be accommodated in the smartphone 1100. Some of the electronic components 1120 may be the above-described chip-related components, for example, electronic component-embedded substrates 1121, but are not limited thereto. The electronic component-embedded substrate 1121 may be in a type in which an electronic component is embedded in a multilayer printed circuit board, but is not limited thereto. Meanwhile, the electronic device is not necessarily limited to the smartphone 1100, and may be another electronic device as described above.

Figure 3:
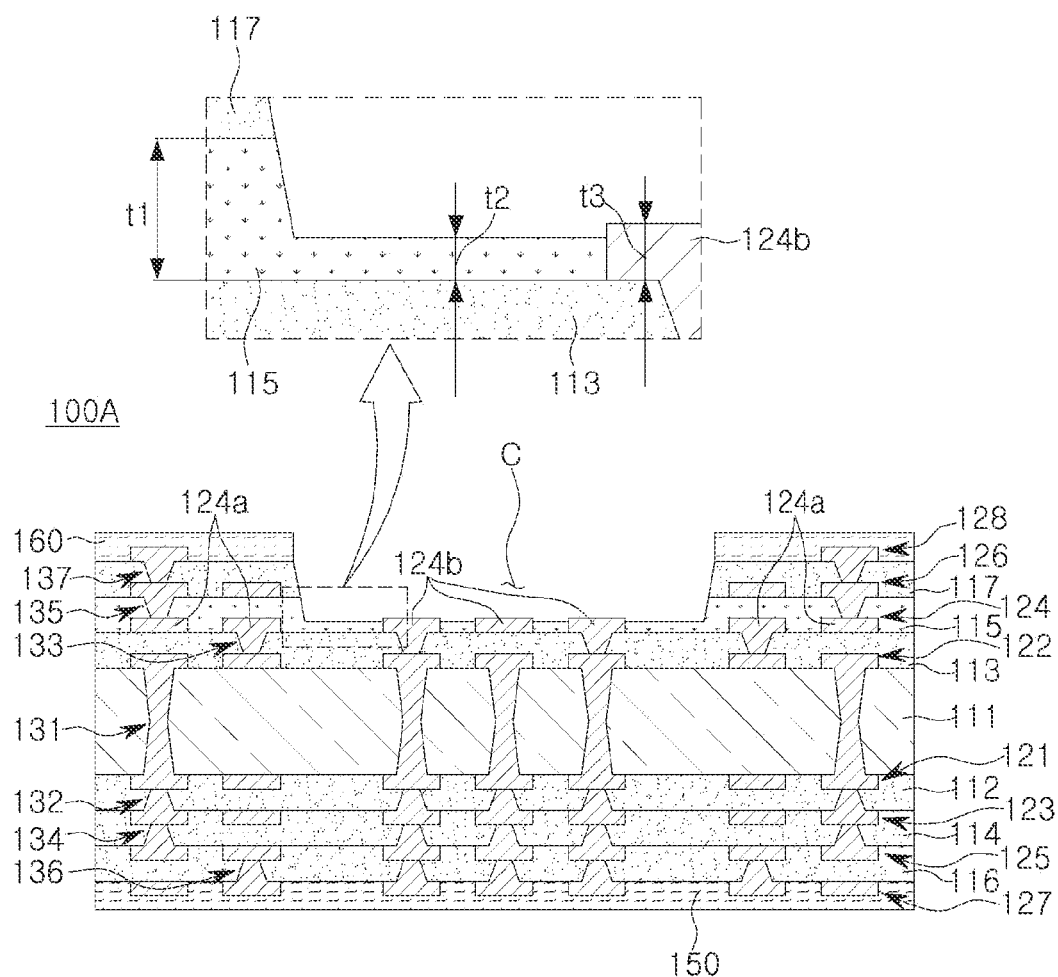
FIG. 3 is a cross-sectional view schematically illustrating an exemplary embodiment of a printed circuit board.

FIG. 3 is a cross-sectional view schematically illustrating an exemplary embodiment of a printed circuit board.

Referring to FIG. 3, the printed circuit board 100A according to an exemplary embodiment may include first to seventh insulating layers 111 to 117, first to eighth wiring layers 121 to 128, first to seventh wiring via layers 131 to 137, and first and second passivation layers 150 and 160. In addition, the printed circuit board 100A according to an exemplary embodiment may have a cavity C penetrating through the seventh insulating layer 117 and a portion of the fifth insulating layer 115. The cavity C may expose a portion of an upper surface of the fifth insulating layer 115. The exposed portion of the upper surface of the fifth insulating layer 115 may serve as a bottom surface of the cavity C. The fourth wiring layer 124 may include a first wiring pattern 124a buried in the fifth insulating layer 115 and a second wiring pattern 124b of which a portion is buried in the fifth insulating layer 115 and the other portion is exposed from the fifth insulating layer 115 by the cavity C.

Since the printed circuit board 100A according to an exemplary embodiment has the cavity C and the second wiring pattern 124b is exposed through the cavity C as described above, an electronic component can be mounted in the cavity C, and accordingly, the printed circuit board 100A can be thin even when the electronic component is mounted thereon. In addition, the cavity C may be manufactured using a blast processing technique or a plasma processing technique as in a process to be described later. In addition, since a portion of the second wiring pattern 124b exposed by the cavity C is buried in the fifth insulating layer 115, a delamination defect can be prevented.

Meanwhile, an upper surface of the second wiring pattern 124b may form a step structure with an upper surface of the fifth insulating layer 115.

For example, in the printed circuit board 100A according to an exemplary embodiment, the second wiring pattern 124b may protrude such that the upper surface thereof is higher than the exposed upper surface of the fifth insulating layer 115. Therefore, in the printed circuit board 100A according to an exemplary embodiment, when t1 denotes a thickness of a portion of the fifth insulating layer 115 covered by the seventh insulating layer 117, t2 denotes a thickness of a portion of the fifth insulating layer 115 exposed by the cavity C, and t3 denotes a thickness of the second wiring pattern 124b, t1>t3>t2 may be satisfied. A lower surface of the second wiring pattern 124b may be coplanar with a lower surface of the fifth insulating layer 115. The term "coplanar" may conceptually include "approximately coplanar", and for example, may include a margin of error that may be made in a manufacturing process. Such a stepped structure makes it easier to mount the electronic component.

Meanwhile, the fifth insulating layer 115 may serve as a barrier layer at the time of performing blast processing for forming the cavity C. In this case, a separate pattern layer used as a stopper for forming the cavity C may be omitted. Therefore, the process can be simplified, with no position matching issue, resulting in a size reduction effect. From this point of view, the fifth insulating layer 115 may have a smaller modulus than the seventh insulating layer 117 in which the cavity C is formed. For example, the fifth insulating layer 115 may have a first modulus, the seventh insulating layer 117 may have a second modulus, and the second modulus may be greater than the first modulus. In this case, at the time of blast processing, the seventh insulating layer 117, which has a relatively great modulus, may be processed, while the fifth insulating layer 115, which has a relatively small modulus, may be partially processed.

Specifically, the cavity C may be formed by mechanical processing using a blast processing technique or the like, in which an abrasive material is sprayed under a pneumatic pressure. At this time, an etched amount may vary depending on a modulus, a mechanical property of an object to be processed. For example, the smaller the modulus, the smaller the etched amount. Therefore, when the fifth insulating layer 115 has a smaller modulus than the seventh insulating layer 117, the fifth insulating layer 115 may be effectively used as a barrier layer at the time of processing for forming the cavity C. Here, the modulus refers to a ratio of stress and strain, for example a slope of load expressed in gigapascals (GPa) relative to initial strain in a stress-strain curve that is obtained by measurement until a fracture occurs at room temperature using a universal testing machine (UTM), but is not limited thereto.

For example, as shown in Table 1 below, Material 1 that is usable as a material of the fifth insulating layer 115, such as an Ajinomoto build-up film (ABF), may have a relatively small modulus of 5 GPa or less. Therefore, an etched amount of Material 1 based on microblasting (pBlast) may be relatively small, i.e. about 3 μm to 6 μm. Material 2 that is usable as a material of the seventh insulating layer 117, such as prepreg (PPG), may have a relatively large modulus of 20 GPa or more. Therefore, an etched amount of Material 2 based on microblasting may be relatively large, i.e. about 30 μm. That is, the modulus of Material 2 may be about four or more times that of Material 1, and as a result, the etched amount of Material 2 may be about five to ten times that of Material 1. Accordingly, at the time of forming the cavity C penetrating through the seventh insulating layer 117 by blast processing, the fifth insulating layer 115 can be effectively used as a barrier layer.

TABLE 1

| Item | Modulus [GPa] | Elongation [%] | Etched amount [μm] |
|---|---|---|---|
| Material 1 | ≤5 | 5.6 | 3-6 |
| Material 2 | ≥20 | <1 | 30 |

Meanwhile, the material of the fifth insulating layer 115 is not limited to ABF. As a material of the fifth insulating layer 115, a relatively small-modulus material, such as polyimide (PI), liquid crystal polymer (LCP), or resin coated copper (RCC), may also be used. In addition, the material of the seventh insulating layer 117 is not limited to PPG. As a material of the seventh insulating layer 117, a relatively high-modulus insulating material, such as copper clad laminate (CCL), may also be used. From this point of view, the material of the fifth insulating layer 115 may be a material containing an insulating resin without a glass fiber, or a material containing an insulating resin together with an inorganic filler and/or an organic filler without a glass fiber. In addition, the material of the seventh insulating layer 117 may be a material containing an insulating resin and an inorganic filler together with a glass fiber.

Hereinafter, each component included in the printed circuit board 100A according to an exemplary embodiment will be additionally described with reference to the drawings.

The first to seventh insulating layers 111 to 117 may include a first insulating layer 111, second and third insulating layers 112 and 113 disposed on both surfaces of the first insulating layer 111 respectively, fourth and fifth insulating layers 114 and 115 disposed on the second and third insulating layers 112 and 113 respectively, and sixth and seventh insulating layers 116 and 117 disposed on the fourth and fifth insulating layers 114 and 115 respectively. That is, the first to seventh insulating layers 111 to 117 may be in a cored type. Concerning the first to seventh insulating layers 111 to 117, the number of insulating layers may decrease or increase.

As a material of the first to seventh insulating layers 111 to 117, an insulating material may be used. Here, the insulating material may be a thermosetting resin such as an epoxy resin, a thermoplastic resin such as polyimide, or a thermosetting or thermoplastic resin mixed with an inorganic filler such as silica and/or a reinforcing material such as a glass fiber. For example, an insulating material such as a copper clad laminate may be used as a material of the first insulating layer 111. In addition, PPG may be used as a material of the second to fourth and sixth to seventh insulating layers 112, 113, 114, 116, and 117. In addition, ABF, LCP, PI, or the like may be used as a material of the fifth insulating layer 115. The first insulating layer 111 may be thicker than each of the second to seventh insulating layers 112 to 117.

The cavity C may penetrate through the seventh insulating layer 117. The cavity C may be tapered such that a width becomes gradually smaller from an upper side to a lower side thereof in a cross-sectional view. The cavity C may have a ring shape, such as an approximately square ring, in a plane view. The upper surface of the fifth insulating layer 115 exposed by the cavity C may serve as the bottom surface of the cavity C. Corners of the bottom surface of the cavity C may be configured by the fifth insulating layer 115.

The first to eighth wiring layers 121 to 128 may include first and second wiring layers 121 and 122 disposed on both surfaces of the first insulating layer 111 respectively, third and fourth wiring layers 123 and 124 disposed on the second and third insulating layers 112 and 113 and buried in the fourth and fifth insulating layers 114 and 115 respectively, fifth and sixth wiring layers 125 and 126 disposed on the fourth and fifth insulating layers 114 and 115 and buried in the sixth and seventh insulating layers 116 and 117 respectively, and seventh and eighth wiring layers 127 and 128 disposed on the sixth and seventh insulating layers 116 and 117 respectively.

Concerning the first to eighth wiring layers 121 to 128, the number of wiring layers may decrease or increase.

As a material of the first to eighth wiring layers 121 to 128, a metal material may be used. Here, the metal material may be copper (Cu), aluminum (Al), silver (Ag), tin (Sn), gold (Au), nickel (Ni), lead (Pb), titanium (Ti), or an alloy thereof. Each of the first to eighth wiring layers 121 to 128 may perform various functions according to the design. For example, each of the first to eighth wiring layers 121 to 128 may include a ground pattern, a power pattern, a signal pattern, and the like. Here, the signal pattern may include various signals, e.g. data signals, excluding the ground pattern and the power pattern. Each of these patterns may have a line, plane, or pad shape. Each of the first to eighth wiring layers 121 to 128 may be formed by plating such as an additive process (AP), a semi-additive process (SAP), a modified semi-additive process (MSAP), or tenting (TT). As a result, each of the first to eighth wiring layers 121 to 128 may include a seed layer, an electroless plating layer, and an electrolytic plating layer, formed on the basis of the seed layer. A specific layer may further include a copper foil.

The first to seventh wiring via layers 131 to 137 may include a first wiring via layer 131 penetrating through the first insulating layer 111 and connecting the first and second wiring layers 121 and 122 to each other, a second wiring via layer 132 penetrating through the second insulating layer 112 and connecting the first and third wiring layers 121 and 123 to each other, a third wiring via layer 133 penetrating through the third insulating layer 113 and connecting the second and fourth wiring layers 122 and 124 to each other, a fourth wiring via layer 134 penetrating through the fourth insulating layer 114 and connecting the third and fifth wiring layers 123 and 125 to each other, a fifth wiring via layer 135 penetrating through the fifth insulating layer 115 and connecting the fourth and sixth wiring layers 124 and 126 to each other, a sixth wiring via layer 136 penetrating through the sixth insulating layer 116 and connecting the fifth and seventh wiring layers 125 and 127 to each other, and a seventh wiring via layer 137 penetrating through the seventh insulating layer 117 and connecting the sixth and eighth wiring layers 126 and 128 to each other. Concerning the first to seventh wiring via layers 131 to 137, the number of wiring via layers may decrease or increase.

As a material of the first to seventh wiring via layers 131 to 137, a metal material may be used. Here, the metal material may be copper (Cu), aluminum (Al), silver (Ag), tin (Sn), gold (Au), nickel (Ni), lead (Pb), titanium (Ti), or an alloy thereof. Each of the first to seventh wiring via layers 131 to 137 may include a via for signal connection, a via for ground connection, a via for power connection, and the like according to the design. Wiring vias of the first to seventh wiring via layers 131 to 137 may be each completely filled with the metal material or may be each coated with the metal material along a wall surface of a via hole. The first wiring via layer 131 may have an hourglass or cylindrical shape. The second to seventh wiring via layers 132 to 137 may have a tapered shape. The second, fourth, and sixth wiring via layers 132, 134, and 136 may have shapes tapered in an opposite direction to the third, fifth, and seventh wiring via layers 133, 135, and 137. Each of the first to seventh wiring via layers 131 to 137 may be formed by plating such as AP, SAP, MSAP, or TT, and may include a seed layer, an electroless plating layer, and an electrolytic plating layer, formed on the basis of the seed layer.

The first and second passivation layers 150 and 160 may protect internal components of the printed circuit board 100A from external physical and chemical damage. The first passivation layer 150 may be disposed on the sixth insulating layer 116 disposed on the lowermost side to cover the seventh wiring layer 127 disposed on the lowermost side. The second passivation layer 160 may be disposed on the seventh insulating layer disposed on the uppermost side to cover the eighth wiring layer 128 disposed on the uppermost side. As a material of the first and second passivation layers 150 and 160, an insulating material may be used. Here, the insulating material may be a thermosetting resin such as an epoxy resin, a thermoplastic resin such as polyimide, or a thermosetting or thermoplastic resin mixed with an inorganic filler, e.g. ABF, but is not limited thereto. Additionally, a solder resist (SR) including a photosensitive material may be used.

Figure 4A:
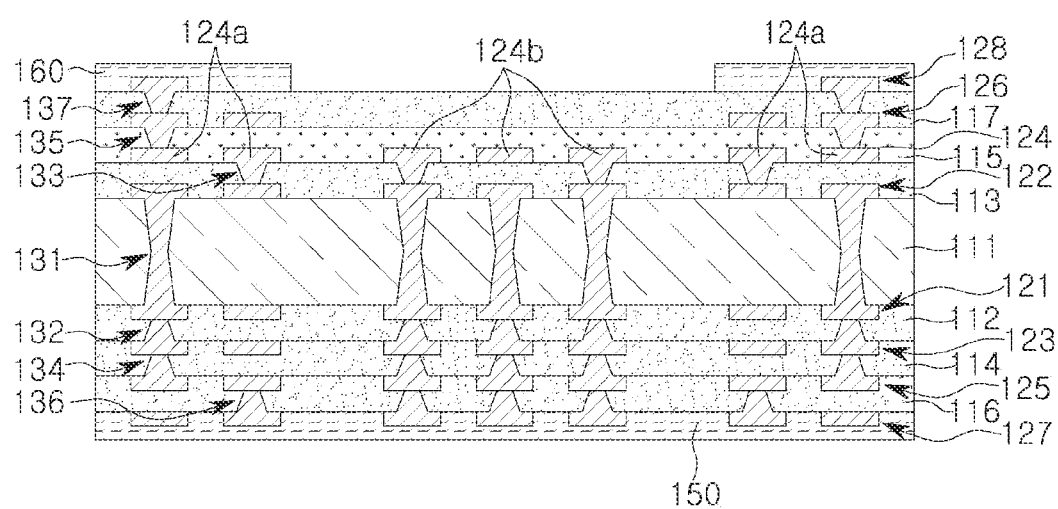
FIGS. 4A through 4C are views schematically illustrating an exemplary embodiment of a process of manufacturing the printed circuit board of FIG. 3.
Figure 4B:
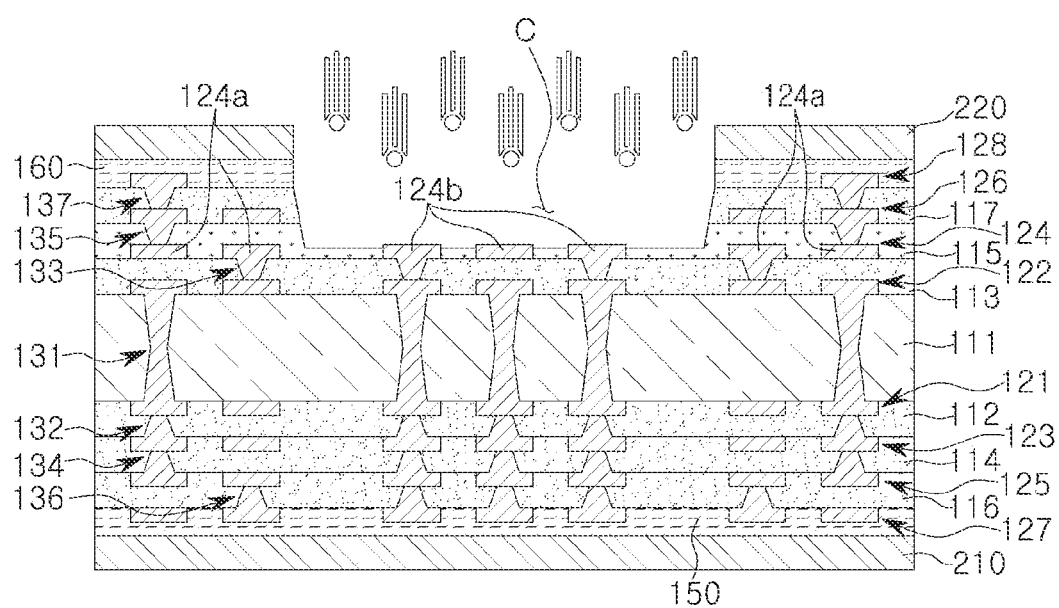
Figure 4C:
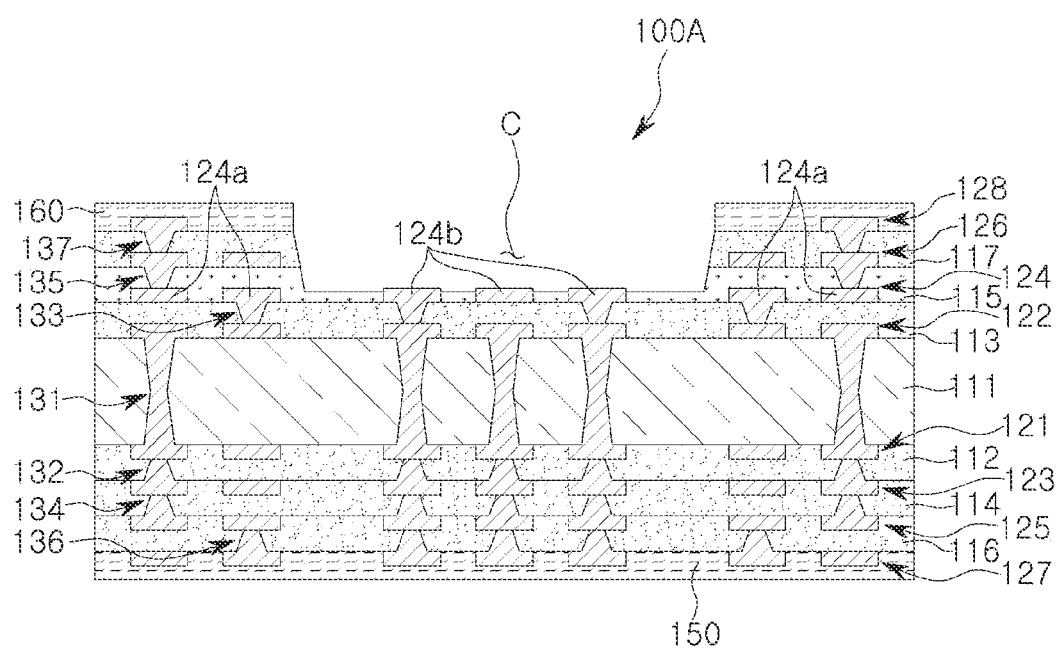

FIGS. 4A through 4C are views schematically illustrating an exemplary embodiment of a process of manufacturing the printed circuit board of FIG. 3.

Referring to FIG. 4A, a printed circuit board may be prepared before forming a cavity C. The printed circuit board may be prepared by forming a first insulating layer 111 using CCL or the like, forming a via hole in the first insulating layer 111 by mechanical drilling or the like and then forming first and second wiring layers 121 and 122 and a first wiring via layer 131 by plating, building up second to seventh insulating layers 112 to 117 on both surfaces of the first insulating layer 111, and forming via holes in the respective layers by laser drilling or the like and forming third to eighth wiring layers 123 to 128 and second to seventh wiring via layers 132 to 137 by plating.

Referring to FIG. 4B, the cavity C may be formed in the printed circuit board. When the cavity C is formed, blast processing may be used. Dry films 210 and 220 may be disposed excluding an area in which the cavity C is formed. By performing the blast processing, the cavity C may be formed to penetrate through the seventh insulating layer 117 and then penetrate through a portion of the fifth insulating layer 115. The stepped structure of the second wiring pattern 124b described above may be implemented by performing the blast processing.

Referring to FIG. 4C, the dry films 210 and 220 may be removed from the printed circuit board. Through such a series of operations, the printed circuit board 100A according to an exemplary embodiment may be manufactured.

Figure 5:
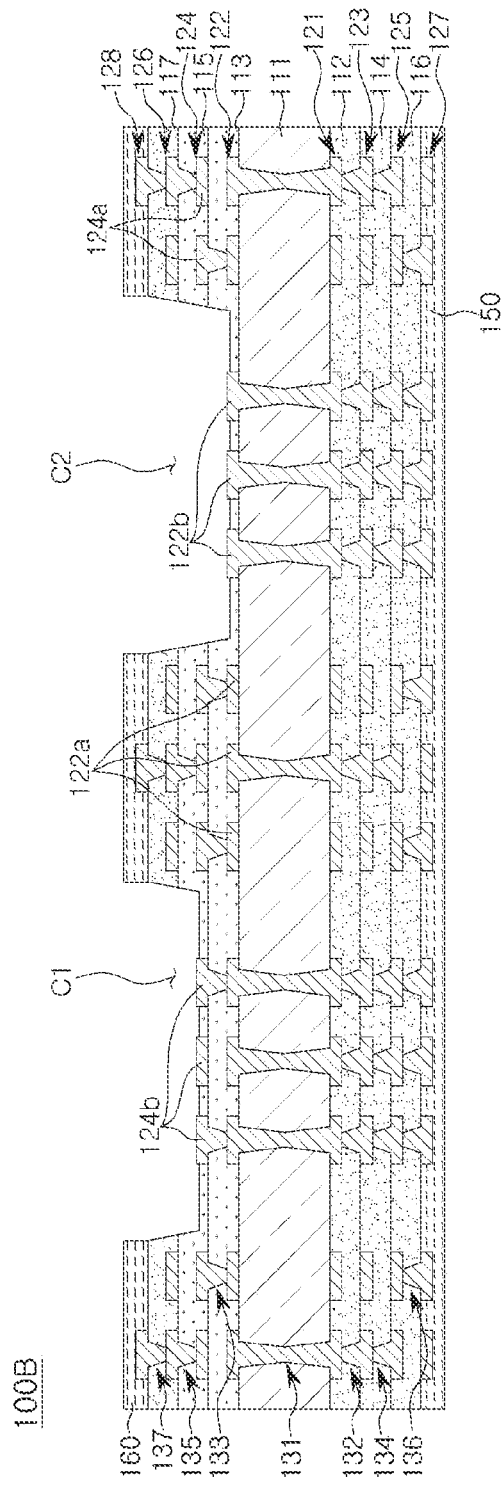
FIG. 5 is a cross-sectional view schematically illustrating another exemplary embodiment of a printed circuit board.

FIG. 5 is a cross-sectional view schematically illustrating another exemplary embodiment of a printed circuit board.

Referring to FIG. 5, the printed circuit board 100B according to another exemplary embodiment may have a plurality of cavities C1 and C2 instead of one cavity C in the printed circuit board 100A according to an exemplary embodiment described above. The first cavity C1 may penetrate through the seventh insulating layer 117 and a portion of the fifth insulating layer 115, and expose a portion of an upper surface of the fifth insulating layer 115. The exposed portion of the upper surface of the fifth insulating layer 115 may serve as a bottom surface of the first cavity C1. The fourth wiring layer 124 may include a first wiring pattern 124a buried in the fifth insulating layer 115 and a second wiring pattern 124b of which a portion is buried in the fifth insulating layer 115 and the other portion is exposed from the fifth insulating layer 115 by the first cavity C1. The second cavity C2 may penetrate through the seventh insulating layer 117, the fifth insulating layer 115, and a portion of the third insulating layer 113, and expose a portion of an upper surface of the third insulating layer 113. The exposed portion of the upper surface of the third insulating layer 113 may serve as a bottom surface of the second cavity C2. The second wiring layer 122 may include a third wiring pattern 122a buried in the third insulating layer 113 and a fourth wiring pattern 122b of which a portion is buried in the third insulating layer 113 and the other portion is exposed from the third insulating layer 113 by the second cavity C2. The second cavity C2 may be deeper than the first cavity C1. When the printed circuit board 100B includes a plurality of cavities C1 and C2 having various depths as described above, a plurality of electronic components having different heights may be easily mounted on the printed circuit board 100B.

Meanwhile, an upper surface of the second wiring pattern 124b may form a step structure with an upper surface of the fifth insulating layer 115. For example, in the printed circuit board 100B according to another exemplary embodiment, the second wiring pattern 124b may protrude such that the upper surface thereof is higher than the exposed upper surface of the fifth insulating layer 115. Therefore, in the printed circuit board 100B according to another exemplary embodiment, a portion of the fifth insulating layer 115 covered by the seventh insulating layer 117 may be thicker than the second wiring pattern 124b, and the second wiring pattern 124b may be thicker than a portion of the fifth insulating layer 115 exposed by the first cavity C1. A lower surface of the second wiring pattern 124b may be coplanar with a lower surface of the fifth insulating layer 115.

Also, an upper surface of the fourth wiring pattern 122b may form a step structure with an upper surface of the third insulating layer 113. For example, in the printed circuit board 100B according to another exemplary embodiment, the fourth wiring pattern 122b may protrude such that the upper surface thereof is higher than the exposed upper surface of the third insulating layer 113. Therefore, in the printed circuit board 100B according to another exemplary embodiment, a portion of the third insulating layer 113 covered by the fifth insulating layer 115 may be thicker than the fourth wiring pattern 122b, and the fourth wiring pattern 122b may be thicker than a portion of the third insulating layer 113 exposed by the second cavity C2. A lower surface of the fourth wiring pattern 122b may be coplanar with a lower surface of the third insulating layer 113.

Meanwhile, the fifth insulating layer 115 may serve as a barrier layer at the time of performing blast processing for forming the first cavity C1. In this case, a separate pattern layer used as a stopper for forming the first cavity C1 may be omitted. Therefore, the process can be simplified, with no position matching issue, resulting in a size reduction effect. From this point of view, the fifth insulating layer 115 may have a smaller modulus than the seventh insulating layer 117 in which the first cavity C1 is formed. In this case, at the time of blast processing, the fifth insulating layer 115 may be partially processed.

Also, the third insulating layer 113 may serve as a barrier layer at the time of performing blast processing for forming the second cavity C2. In this case, a separate pattern layer used as a stopper for forming the second cavity C2 may be omitted. Therefore, the process can be simplified, with no position matching issue, resulting in a size reduction effect. From this point of view, the third insulating layer 113 may have a smaller modulus than the seventh insulating layer 117 in which the second cavity C2 is formed. In this case, at the time of blast processing, the third insulating layer 113 may be partially processed.

For example, the third and fifth insulating layers 113 and 115 may be formed of ABF or the like, and the seventh insulating layer 117 may be formed of PPG or the like. The material of the third and fifth insulating layers 113 and 115 is not limited to ABF. As a material of the third and fifth insulating layers 113 and 115, a relatively small-modulus material, such as PI, LCP, or RCC, may also be used. In addition, the material of the seventh insulating layer 117 is not limited to PPG. As a material of the seventh insulating layer 117, a relatively high-modulus insulating material, such as CCL, may also be used. From this point of view, the material of the third and fifth insulating layers 113 and 115 may be a material containing an insulating resin without a glass fiber, or a material containing an insulating resin together with an inorganic filler and/or an organic filler without a glass fiber. In addition, the material of the seventh insulating layer 117 may be a material containing an insulating resin and an inorganic filler together with a glass fiber.

The other details are substantially the same as described above, and the overlapping detailed description thereof will be omitted.

FIGS. 6A through 6E are views schematically illustrating an exemplary embodiment of a process of manufacturing the printed circuit board of FIG. 5.

Figure 6A:
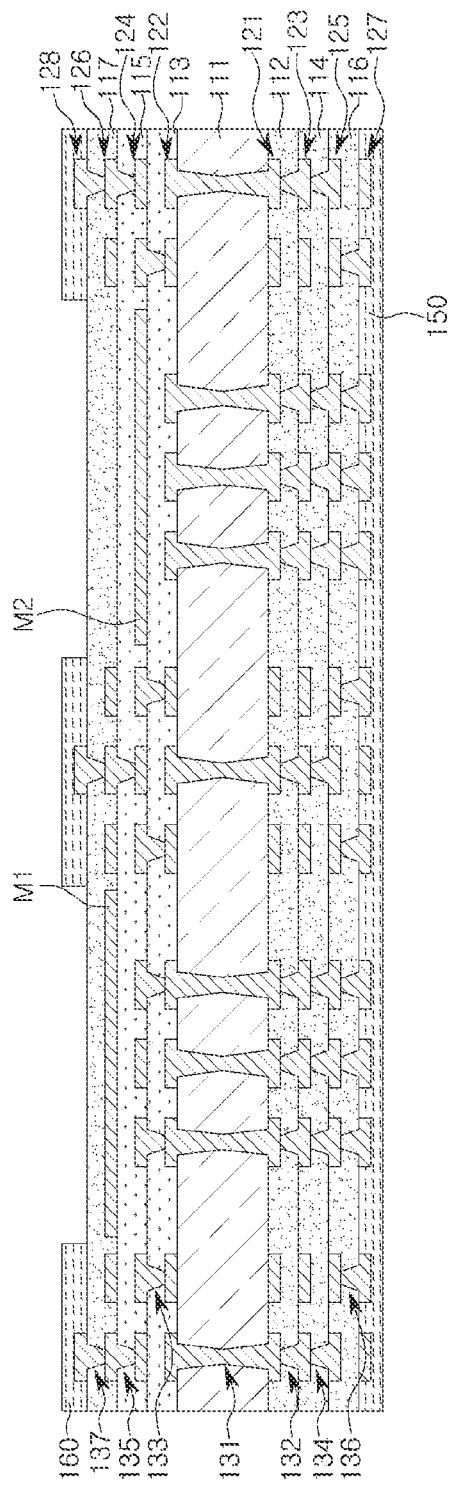
FIGS. 6A through 6E are views schematically illustrating an exemplary embodiment of a process of manufacturing the printed circuit board of FIG. 5.

Referring to FIG. 6A, a printed circuit board may be prepared before forming first and second cavities C1 and C2. The printed circuit board may be prepared by forming a first insulating layer 111 using CCL or the like, forming a via hole in the first insulating layer 111 by mechanical drilling or the like and then forming first and second wiring layers 121 and 122 and a first wiring via layer 131 by plating, building up second to seventh insulating layers 112 to 117 on both surfaces of the first insulating layer 111, and forming via holes in the respective layers by laser drilling or the like and forming third to eighth wiring layers 123 to 128 and second to seventh wiring via layers 132 to 137 by plating. The sixth wiring layer 126 may include a first metal layer M1, and the fourth wiring layer 124 may include a second metal layer M2.

Figure 6B:
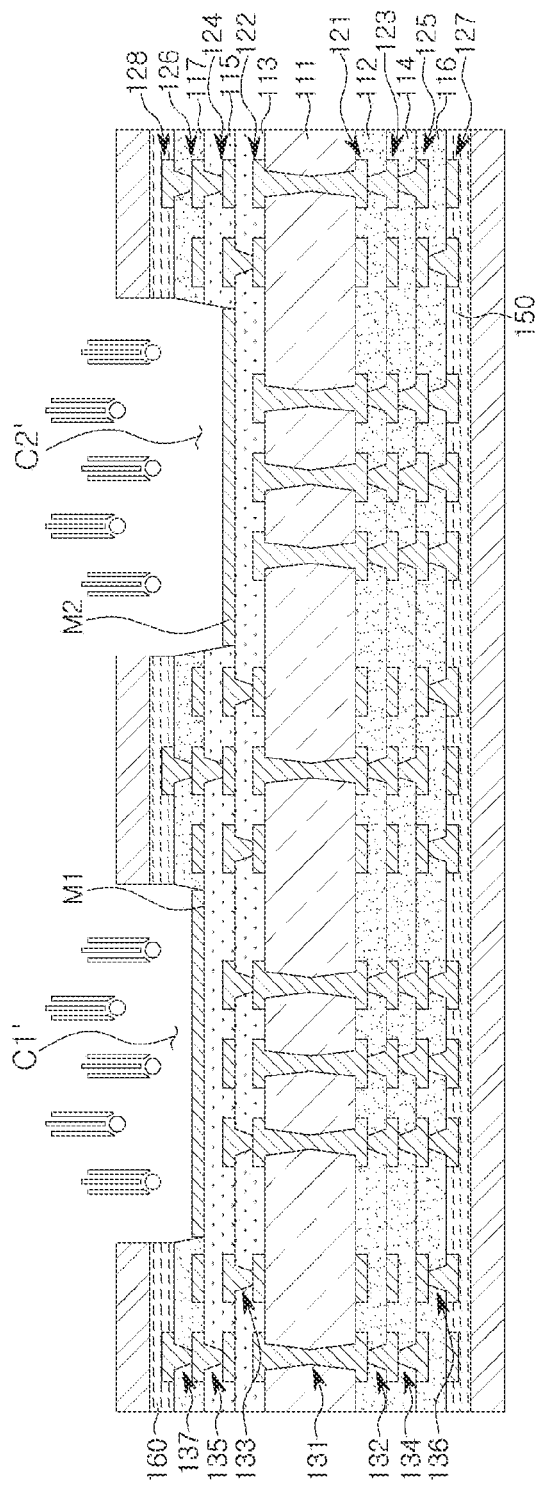

Referring to FIG. 6B, first and second preliminary cavities C1' and C2' may be formed in the printed circuit board. When the first and second preliminary cavities C1' and C2' are formed, blast processing may be used. In this case, the first and second metal layers M1 and M2 may be used as stoppers.

Figure 6C:
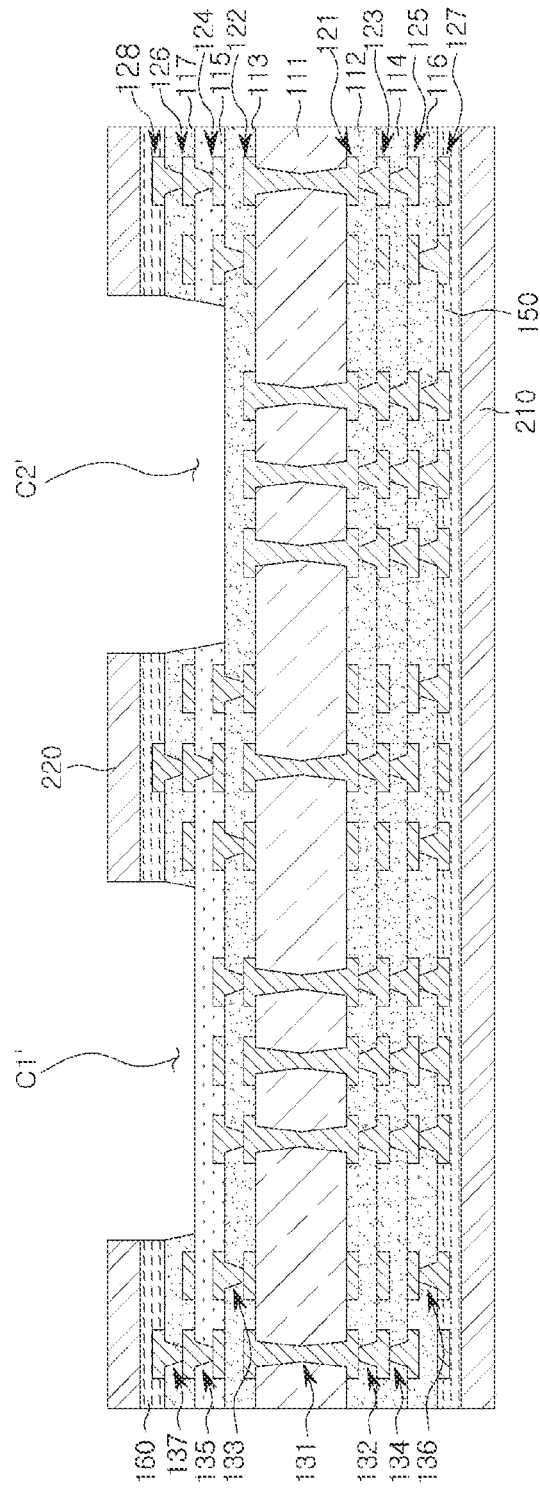

Referring to FIG. 6C, the first and second metal layers M1 and M2 may be removed by etching. The etching may be performed using an etching solution or the like appropriately selected according to the type of metal material of the first and second metal layers M1 and M2.

Figure 6D:
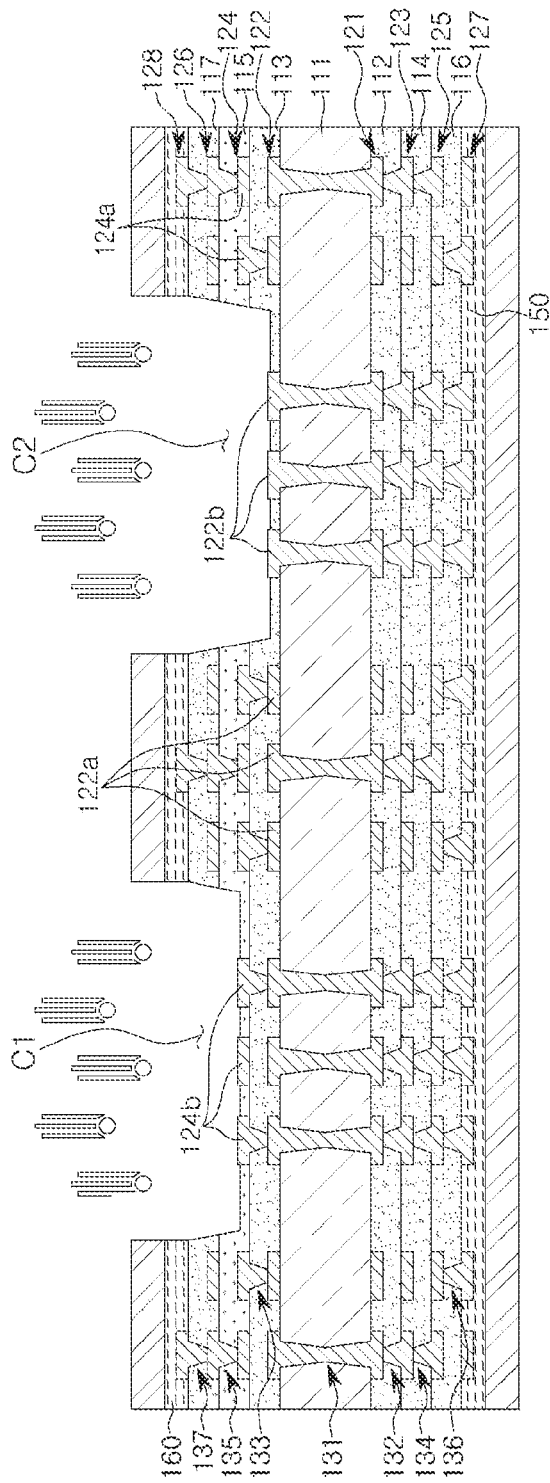

Referring to FIG. 6D, first and second cavities C1 and C2 may be formed in the printed circuit board. When the first and second cavities C1 and C2 are formed, blast processing may be used. Dry films 210 and 220 may be disposed excluding areas in which the first and second cavities C1 and C2 are formed. By performing the blast processing, the first cavity C1 may be formed to penetrate through the seventh insulating layer 117 and then penetrate through a portion of the fifth insulating layer 115, and the second cavity C2 may be formed to penetrate through the seventh insulating layer 117, the fifth insulating layer 115, and a portion of the third insulating layer 113. By performing the blast processing, the second wiring pattern 124b and the fourth wiring pattern 122b may each have a stepped structure.

Figure 6E:
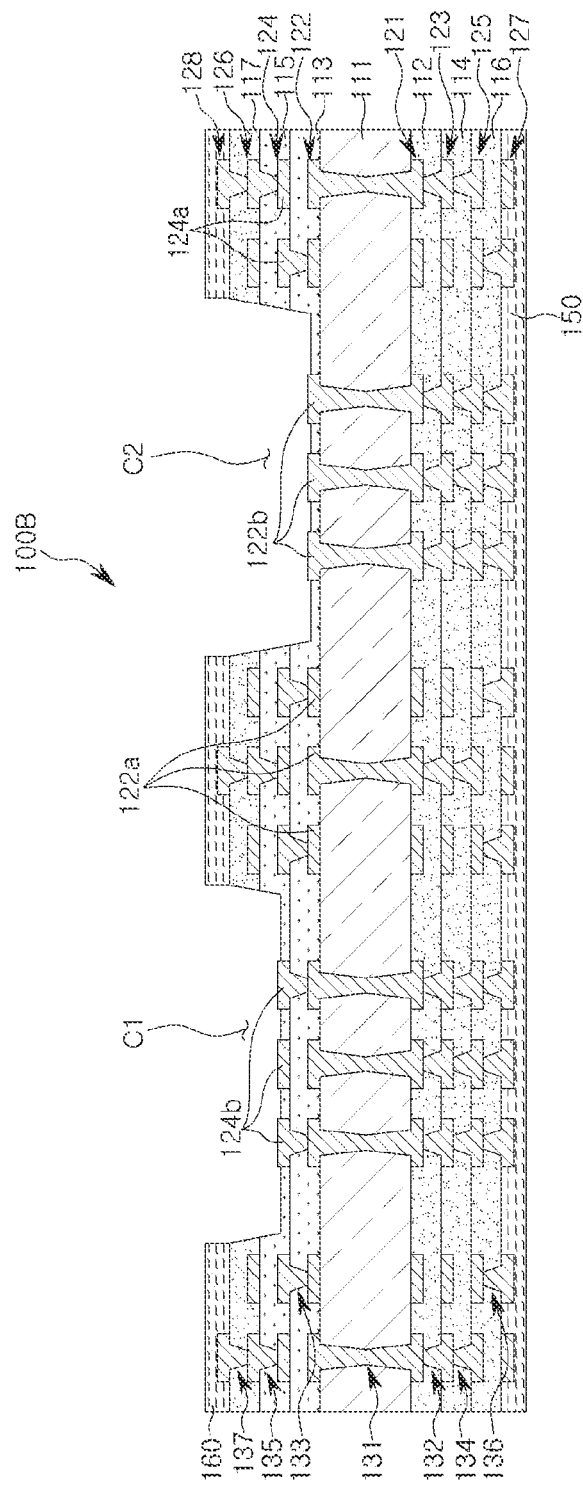

Referring to FIG. 6E, the dry films 210 and 220 may be removed from the printed circuit board. Through such a series of operations, the printed circuit board 100B according to another exemplary embodiment may be manufactured.

Figure 7:
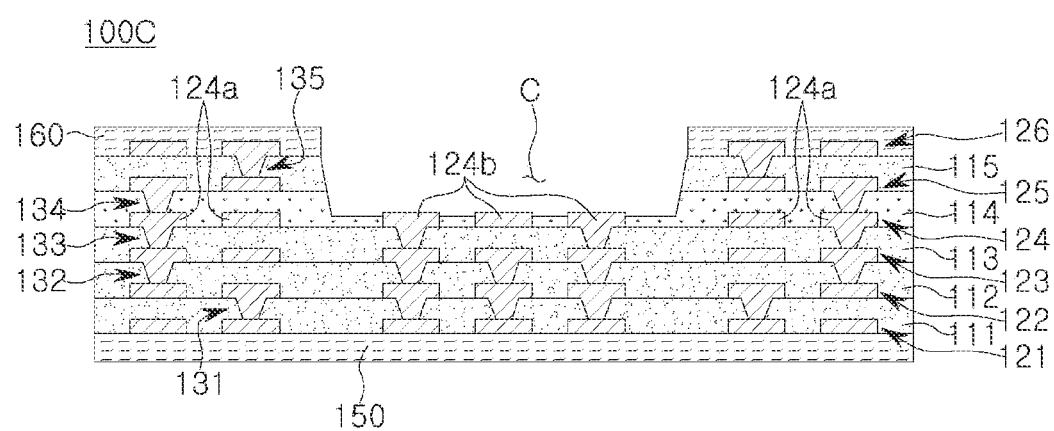
FIG. 7 is a cross-sectional view schematically illustrating another exemplary embodiment of a printed circuit board.

FIG. 7 is a cross-sectional view schematically illustrating another exemplary embodiment of a printed circuit board.

Referring to FIG. 7, the printed circuit board 100C according to another exemplary embodiment may include first to fifth insulating layers 111 to 115, first to sixth wiring layers 121 to 126, first to fifth wiring via layers 131 to 135, and the first and second passivation layers 150 and 160. Also, the printed circuit board 100C according to another exemplary embodiment may have a cavity C penetrating through the fifth insulating layer 115 and a portion of the fourth insulating layer 114. The cavity C may expose a portion of an upper surface of the fourth insulating layer 114. The exposed portion of the upper surface of the fourth insulating layer 114 may serve as a bottom surface of the cavity C. The fourth wiring layer 124 may include a first wiring pattern 124a buried in the fourth insulating layer 114 and a second wiring pattern 124b of which a portion is buried in the fourth insulating layer 114 and the other portion is exposed from the fourth insulating layer 114 by the cavity C.

Meanwhile, an upper surface of the second wiring pattern 124b may form a step structure with an upper surface of the fourth insulating layer 114. For example, in the printed circuit board 100C according to another exemplary embodiment, the second wiring pattern 124b may protrude such that the upper surface thereof is higher than the exposed upper surface of the fourth insulating layer 114. Therefore, in the printed circuit board 100C according to another exemplary embodiment, a portion of the fourth insulating layer 114 covered by the fifth insulating layer 115 may be thicker than the second wiring pattern 124b, and the second wiring pattern 124b may be thicker than a portion of the fourth insulating layer 114 exposed by the cavity C. A lower surface of the second wiring pattern 124b may be coplanar with a lower surface of the fourth insulating layer 114.

Meanwhile, the fourth insulating layer 114 may serve as a barrier layer at the time of performing blast processing for forming the cavity C. In this case, a separate pattern layer used as a stopper for forming the cavity C may be omitted. Therefore, the process can be simplified, with no position matching issue, resulting in a size reduction effect. From this point of view, the fourth insulating layer 114 may have a smaller modulus than the fifth insulating layer 115 in which the cavity C is formed. In this case, at the time of blast processing, the fifth insulating layer 115, which has a relatively great modulus, may be processed, while the fourth insulating layer 114, which has a relatively small modulus, may be partially processed.

For example, the fourth insulating layer 114 may be formed of ABF or the like, and the fifth insulating layer 115 may be formed of PPG or the like. The material of the fourth insulating layer 114 is not limited to ABF. As a material of the fourth insulating layer 114, a relatively small-modulus material, such as PI or LCP, may also be used. In addition, the material of the fifth insulating layer 115 is not limited to PPG. As a material of the fifth insulating layer 115, a relatively high-modulus insulating material, such as CCL, may also be used. From this point of view, the material of the fourth insulating layer 114 may be a material containing an insulating resin without a glass fiber, or a material containing an insulating resin together with an inorganic filler and/or an organic filler without a glass fiber. In addition, the material of the fifth insulating layer 115 may be a material containing an insulating resin and an inorganic filler together with a glass fiber.

Hereinafter, each component included in the printed circuit board 100C according to another exemplary embodiment will be additionally described with reference to the drawings.

The first to fifth insulating layers 111 to 115 may include a first insulating layer 111, a second insulating layer 112 disposed on the first insulating layer 111, a third insulating layer 113 disposed on the second insulating layer 112, a fourth insulating layer 114 disposed on the third insulating layer 113, and a fifth insulating layer 115 disposed on the fourth insulating layer 114. That is, the first to fifth insulating layers 111 to 115 may be in a coreless type. Concerning the first to fifth insulating layers 111 to 115, the number of insulating layers may decrease or increase.

As a material of the first to fifth insulating layers 111 to 115, an insulating material may be used. Here, the insulating material may be a thermosetting resin such as an epoxy resin, a thermoplastic resin such as polyimide, or a thermosetting or thermoplastic resin mixed with an inorganic filler such as silica and/or a reinforcing material such as a glass fiber. For example, PPG may be used as a material of the first, second, third, and fifth insulating layers 111, 112, 113, and 115. In addition, ABF, LCP, PI, or the like may be used as a material of the fourth insulating layer 114. The first to fifth insulating layers 111 to 115 may have the approximately same thickness, but are not limited thereto.

The first to sixth wiring layers 121 to 126 may include a first wiring layer 121 buried in a lower portion of the first insulating layer 111, a second wiring layer 122 disposed on an upper surface of the first insulating layer 111 and buried in a lower portion of the second insulating layer 112, a third wiring layer 123 disposed on an upper surface of the second insulating layer 112 and buried in a lower portion of the third insulating layer 113, a fourth wiring layer 124 disposed on an upper surface of the third insulating layer 113 and buried in a lower portion of the fourth insulating layer 114, a fifth wiring layer 125 disposed on an upper surface of the fourth insulating layer 114 and buried in a lower portion of the fifth insulating layer 115, and a sixth wiring layer 126 disposed on an upper surface of the fifth insulating layer 115. Concerning the first to sixth wiring layers 121 to 126, the number of wiring layers may decrease or increase.

As a material of the first to sixth wiring layers 121 to 126, a metal material may be used. Here, the metal material may be copper (Cu), aluminum (Al), silver (Ag), tin (Sn), gold (Au), nickel (Ni), lead (Pb), titanium (Ti), or an alloy thereof. Each of the first to sixth wiring layers 121 to 126 may perform various functions according to the design. For example, each of the first to sixth wiring layers 121 to 126 may include a ground pattern, a power pattern, a signal pattern, and the like. Each of these patterns may have a line, plane, or pad shape. Each of the first to sixth wiring layers 121 to 126 may be formed by plating such as AP, SAP, MSAP, or TT. As a result, each of the first to sixth wiring layers 121 to 126 may include a seed layer, an electroless plating layer, and an electrolytic plating layer, formed on the basis of the seed layer. A specific layer may further include a copper foil.

The first to fifth wiring via layers 131 to 135 may include a first wiring via layer 131 penetrating through the first insulating layer 111 and connecting the first and second wiring layers 121 and 122 to each other, a second wiring via layer 132 penetrating through the second insulating layer 112 and connecting the second and third wiring layers 122 and 123 to each other, a third wiring via layer 133 penetrating through the third insulating layer 113 and connecting the third and fourth wiring layers 123 and 124 to each other, a fourth wiring via layer 134 penetrating through the fourth insulating layer 114 and connecting the fourth and fifth wiring layers 124 and 125 to each other, and a fifth wiring via layer 135 penetrating through the fifth insulating layer 115 and connecting the fifth and sixth wiring layers 125 and 126. Concerning the first to fifth wiring via layers 131 to 135, the number of wiring via layers may decrease or increase.

The first and second passivation layers 150 and 160 may protect internal components of the printed circuit board 100C from external physical and chemical damage. The first passivation layer 150 may be disposed on the first insulating layer 111 disposed on the lowermost side to cover the first wiring layer 121 disposed on the lowermost side. The second passivation layer 160 may be disposed on the fifth insulating layer disposed on the uppermost side to cover the sixth wiring layer 126 disposed on the uppermost side. As a material of the first and second passivation layers 150 and 160, an insulating material may be used. Here, the insulating material may be a thermosetting resin such as an epoxy resin, a thermoplastic resin such as polyimide, or a thermosetting or thermoplastic resin mixed with an inorganic filler, e.g. ABF, but is not limited thereto. Additionally, a solder resist (SR) including a photosensitive material may be used.

The other details are substantially the same as described above, and the overlapping detailed description thereof will be omitted.

Figure 8A:
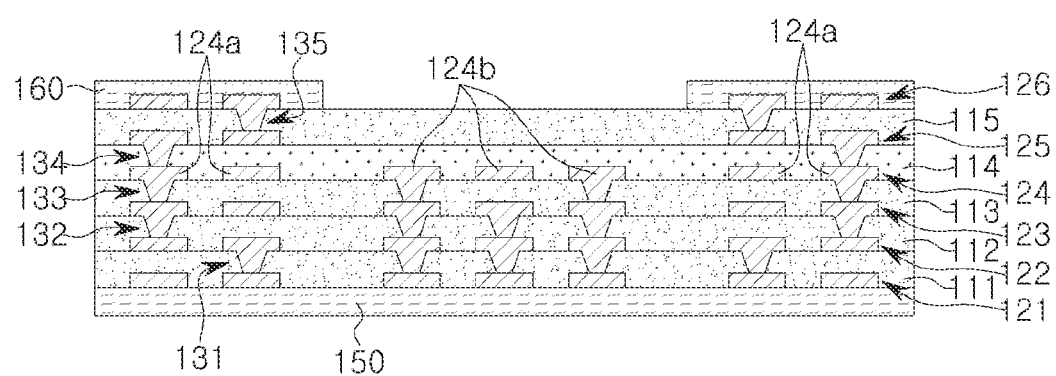
FIGS. 8A through 8C are views schematically illustrating an exemplary embodiment of a process of manufacturing the printed circuit board of FIG. 7.
Figure 8B:
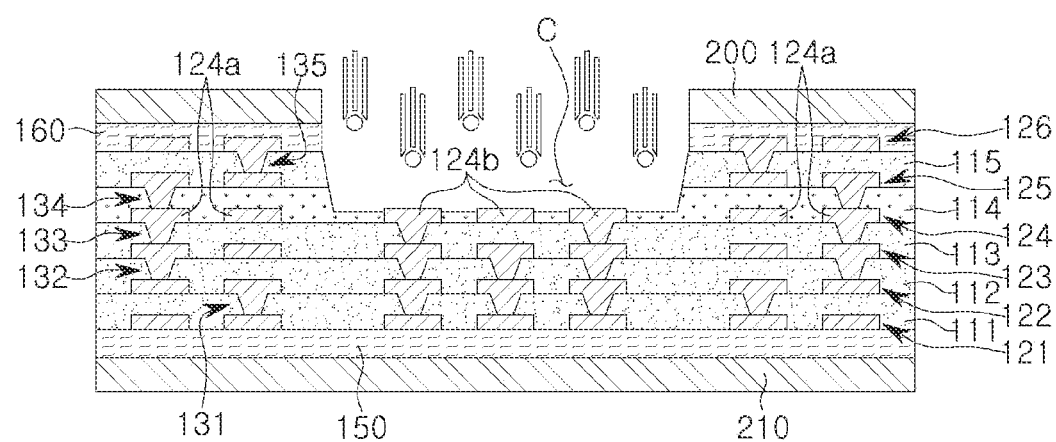
Figure 8C:
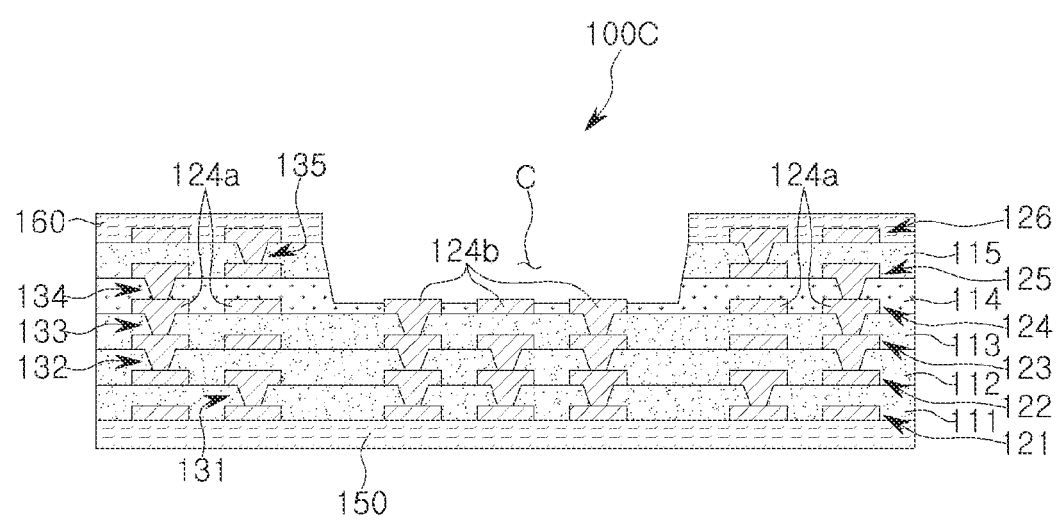

FIGS. 8A through 8C are views schematically illustrating an exemplary embodiment of a process of manufacturing the printed circuit board of FIG. 7.

Referring to FIG. 8A, a printed circuit board may be prepared before forming a cavity C. The printed circuit board may be prepared by forming a first wiring layer 121 on a carrier film by plating, forming a first insulating layer 111 covering the first wiring layer 121, forming a via hole in the first insulating layer 111 by laser drilling or the like, forming a second wiring layer 122 and a first wiring via layer 131 by plating, repeating the foregoing series of operations, and then separating the carrier film and removing a remaining metal foil or the like by etching.

Referring to FIG. 8B, the cavity C may be formed in the printed circuit board. When the cavity C is formed, blast processing may be used. Dry films 210 and 220 may be disposed excluding an area in which the cavity C is formed. By performing the blast processing, the cavity C may be formed to penetrate through the fifth insulating layer 115 and then penetrate through a portion of the fourth insulating layer 114. The stepped structure of the second wiring pattern 124b described above may be implemented by performing the blast processing.

Referring to FIG. 8C, the dry films 210 and 220 may be removed from the printed circuit board. Through such a series of operations, the printed circuit board 100C according to another exemplary embodiment may be manufactured.

Figure 9:
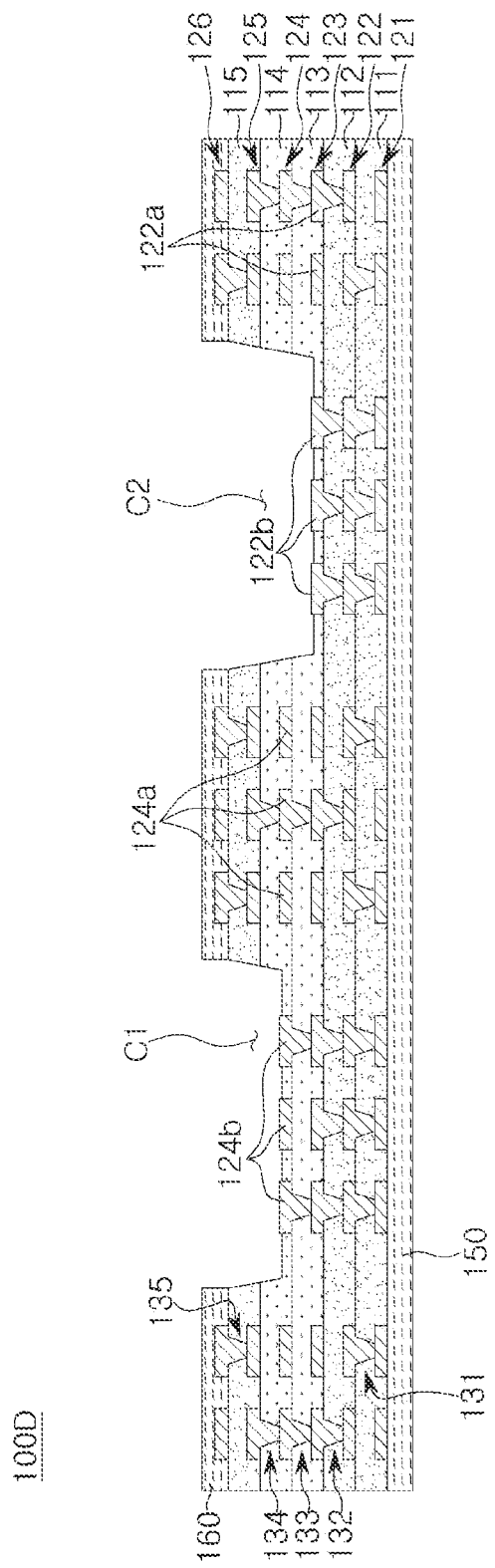
FIG. 9 is a cross-sectional view schematically illustrating another exemplary embodiment of a printed circuit board.

FIG. 9 is a cross-sectional view schematically illustrating another exemplary embodiment of a printed circuit board.

Referring to FIG. 9, the printed circuit board 100D according to another exemplary embodiment may have a plurality of cavities C1 and C2 instead of one cavity C in the printed circuit board 100C according to another exemplary embodiment described above. The first cavity C1 may penetrate through the fifth insulating layer 115 and a portion of the fourth insulating layer 114, and expose a portion of an upper surface of the fourth insulating layer 114. The exposed portion of the upper surface of the fourth insulating layer 114 may serve as a bottom surface of the first cavity C1. The fourth wiring layer 124 may include a first wiring pattern 124a buried in the fourth insulating layer 114 and a second wiring pattern 124b of which a portion is buried in the fourth insulating layer 114 and the other portion is exposed from the fourth insulating layer 114 by the first cavity C1. The second cavity C2 may penetrate through the fifth insulating layer 115, the fourth insulating layer 114, and a portion of the third insulating layer 113, and expose a portion of an upper surface of the third insulating layer 113. The exposed portion of the upper surface of the third insulating layer 113 may serve as a bottom surface of the second cavity C2. The third wiring layer 123 may include a third wiring pattern 122a buried in the third insulating layer 113 and a fourth wiring pattern 122b of which a portion is buried in the third insulating layer 113 and the other portion is exposed from the third insulating layer 113 by the second cavity C2. The second cavity C2 may be deeper than the first cavity C1.

Meanwhile, an upper surface of the second wiring pattern 124b may form a step structure with an upper surface of the fourth insulating layer 114. For example, in the printed circuit board 100D according to another exemplary embodiment, the second wiring pattern 124b may protrude such that the upper surface thereof is higher than the exposed upper surface of the fourth insulating layer 114. Therefore, in the printed circuit board 100D according to another exemplary embodiment, a portion of the fourth insulating layer 114 covered by the fifth insulating layer 115 may be thicker than the second wiring pattern 124b, and the second wiring pattern 124b may be thicker than a portion of the fourth insulating layer 114 exposed by the first cavity C1. A lower surface of the second wiring pattern 124b may be coplanar with a lower surface of the fourth insulating layer 114.

Also, an upper surface of the fourth wiring pattern 122b may form a step structure with an upper surface of the third insulating layer 113. For example, in the printed circuit board 100D according to another exemplary embodiment, the fourth wiring pattern 122b may protrude such that the upper surface thereof is higher than the exposed upper surface of the third insulating layer 113. Therefore, in the printed circuit board 100D according to another exemplary embodiment, a portion of the third insulating layer 113 covered by the fourth insulating layer 114 may be thicker than the fourth wiring pattern 122b, and the fourth wiring pattern 122b may be thicker than a portion of the third insulating layer 113 exposed by the second cavity C2. A lower surface of the fourth wiring pattern 122b may be coplanar with a lower surface of the third insulating layer 113.

Meanwhile, the fourth insulating layer 114 may serve as a barrier layer at the time of performing blast processing for forming the first cavity C1. In this case, a separate pattern layer used as a stopper for forming the first cavity C1 may be omitted. Therefore, the process can be simplified, with no position matching issue, resulting in a size reduction effect. From this point of view, the fourth insulating layer 114 may have a smaller modulus than the fifth insulating layer 115 in which the first cavity C1 is formed. In this case, at the time of blast processing, the fourth insulating layer 114 may be partially processed.

Also, the third insulating layer 113 may serve as a barrier layer at the time of performing blast processing for forming the second cavity C2. In this case, a separate pattern layer used as a stopper for forming the second cavity C2 may be omitted. Therefore, the process can be simplified, with no position matching issue, resulting in a size reduction effect. From this point of view, the third insulating layer 113 may have a smaller modulus than the fifth insulating layer 115 in which the second cavity C2 is formed. In this case, at the time of blast processing, the third insulating layer 113 may be partially processed.

For example, the third and fourth insulating layers 113 and 114 may be formed of ABF or the like, and the fifth insulating layer 115 may be formed of PPG or the like. The material of the third and fourth insulating layers 113 and 114 is not limited to ABF. As a material of the third and fourth insulating layers 113 and 114, a relatively small-modulus material, such as PI or LCP, may also be used. In addition, the material of the fifth insulating layer 115 is not limited to PPG. As a material of the fifth insulating layer 115, a relatively high-modulus insulating material, such as CCL, may also be used. From this point of view, the material of the third and fourth insulating layers 113 and 114 may be a material containing an insulating resin without a glass fiber, or a material containing an insulating resin together with an inorganic filler and/or an organic filler without a glass fiber. In addition, the material of the fifth insulating layer 115 may be a material containing an insulating resin and an inorganic filler together with a glass fiber.

The other details are substantially the same as described above, and the overlapping detailed description thereof will be omitted.

FIGS. 10A through 10E are views schematically illustrating an exemplary embodiment of a process of manufacturing the printed circuit board of FIG. 9.

Figure 10A:
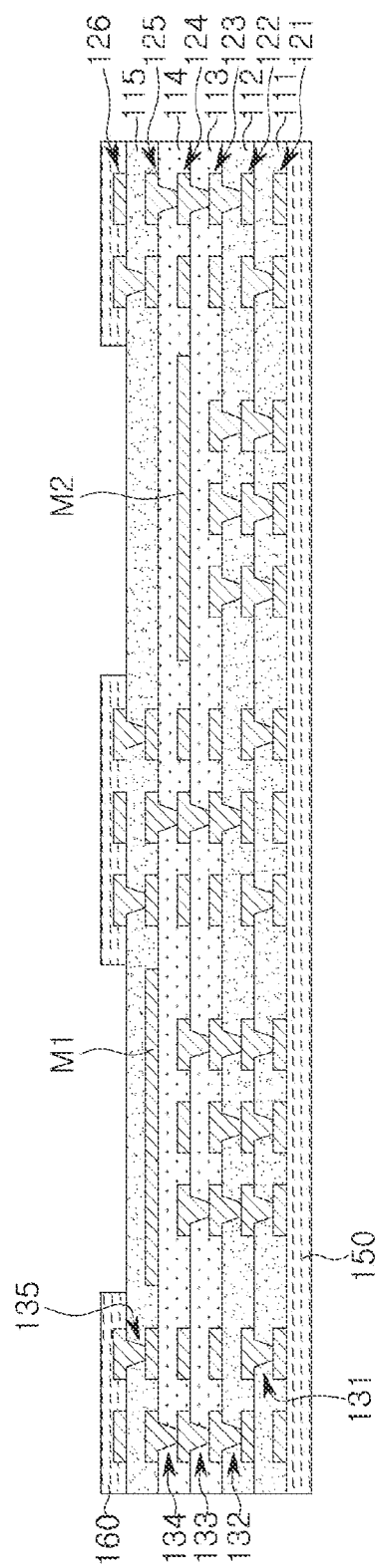
FIGS. 10A through 10E are views schematically illustrating an exemplary embodiment of a process of manufacturing the printed circuit board of FIG. 9.

Referring to FIG. 10A, a printed circuit board may be prepared before forming first and second cavities C1 and C2. The printed circuit board may be prepared by a first wiring layer 121 on a carrier film by plating, forming a first insulating layer 111 covering the first wiring layer 121, forming a via hole in the first insulating layer 111 by laser drilling or the like, forming a second wiring layer 122 and a first wiring via layer 131 by plating, repeating the foregoing series of operations, and then separating the carrier film and removing a remaining metal foil or the like by etching. The fifth wiring layer 125 may include a first metal layer M1, and the fourth wiring layer 124 may include a second metal layer M2.

Figure 10B:
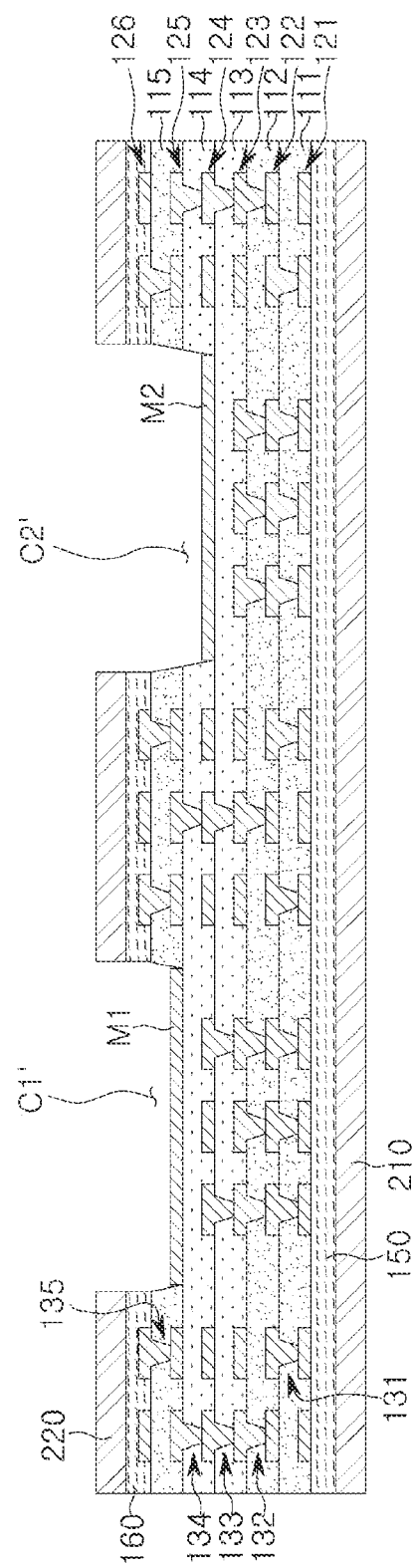

Referring to FIG. 10B, first and second preliminary cavities C1' and C2' may be formed in the printed circuit board. When the first and second preliminary cavities C1' and C2' are formed, blast processing may be used. In this case, the first and second metal layers M1 and M2 may be used as stoppers.

Figure 10C:
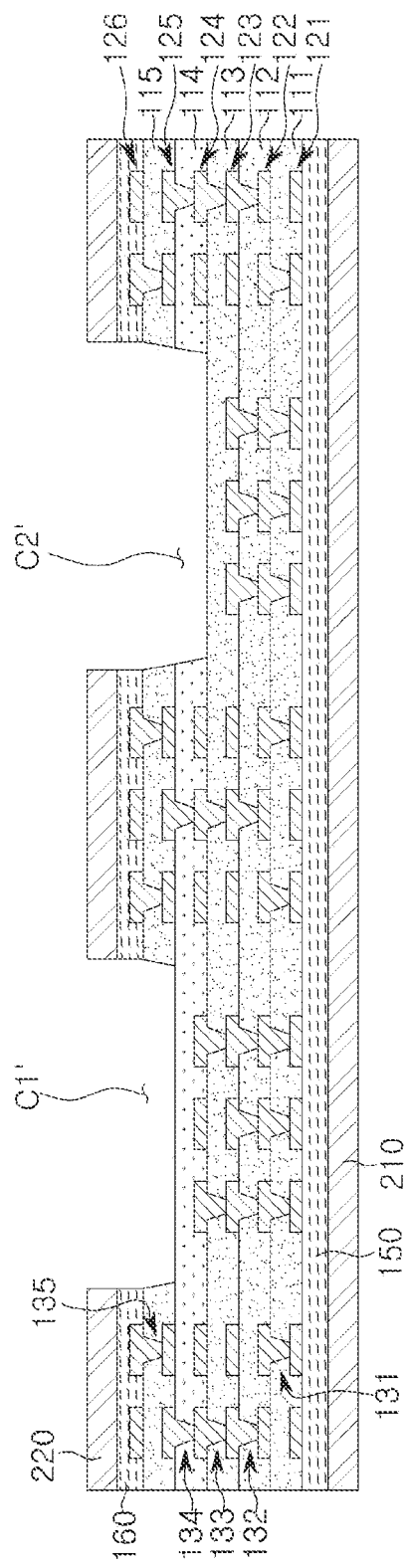

Referring to FIG. 10C, the first and second metal layers M1 and M2 may be removed by etching. The etching may be performed using an etching solution or the like appropriately selected according to the type of metal material of the first and second metal layers M1 and M2.

Figure 10D:
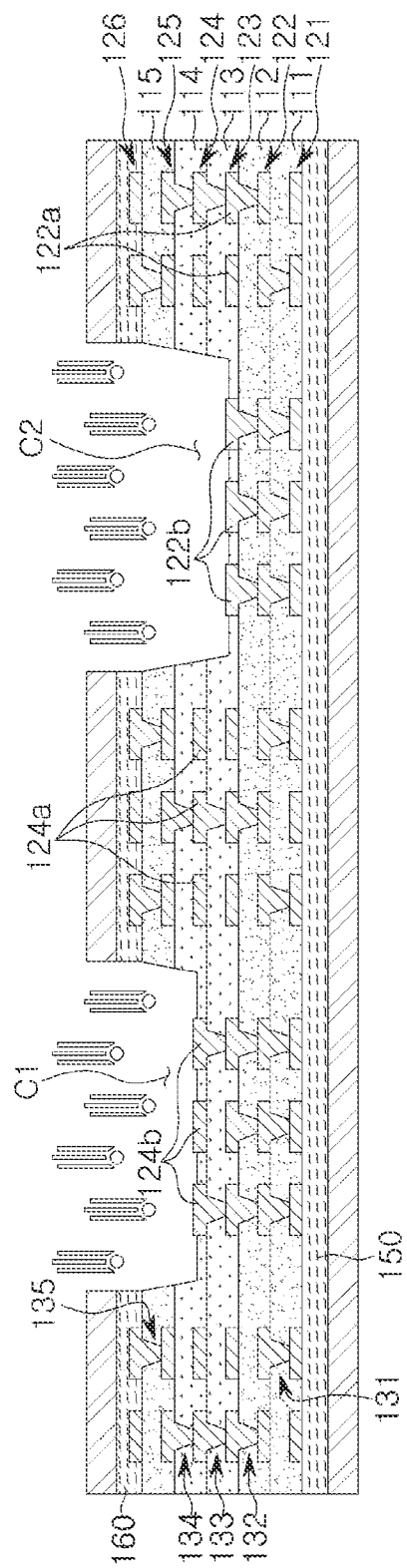

Referring to FIG. 10D, first and second cavities C1 and C2 may be formed in the printed circuit board. When the first and second cavities C1 and C2 are formed, blast processing may be used. Dry films 210 and 220 may be disposed excluding areas in which the first and second cavities C1 and C2 are formed. By performing the blast processing, the first cavity C1 may be formed to penetrate through the fifth insulating layer 115 and then penetrate through a portion of the fourth insulating layer 114, and the second cavity C2 may be formed to penetrate through the fifth insulating layer 115, the fourth insulating layer 114, and a portion of the third insulating layer 113. By performing the blast processing, the second wiring pattern 124b and the fourth wiring pattern 122b may each have a stepped structure.

Figure 10E:
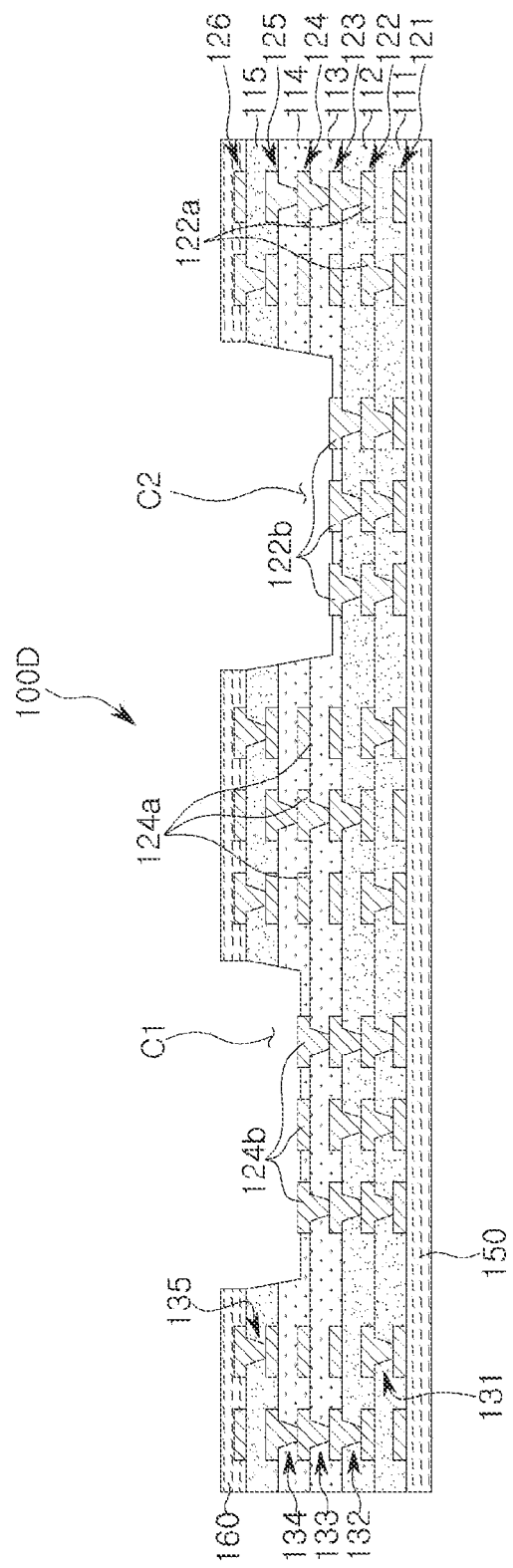

Referring to FIG. 10E, the dry films 210 and 220 may be removed from the printed circuit board. Through such a series of operations, the printed circuit board 100D according to another exemplary embodiment may be manufactured.

Figure 11:
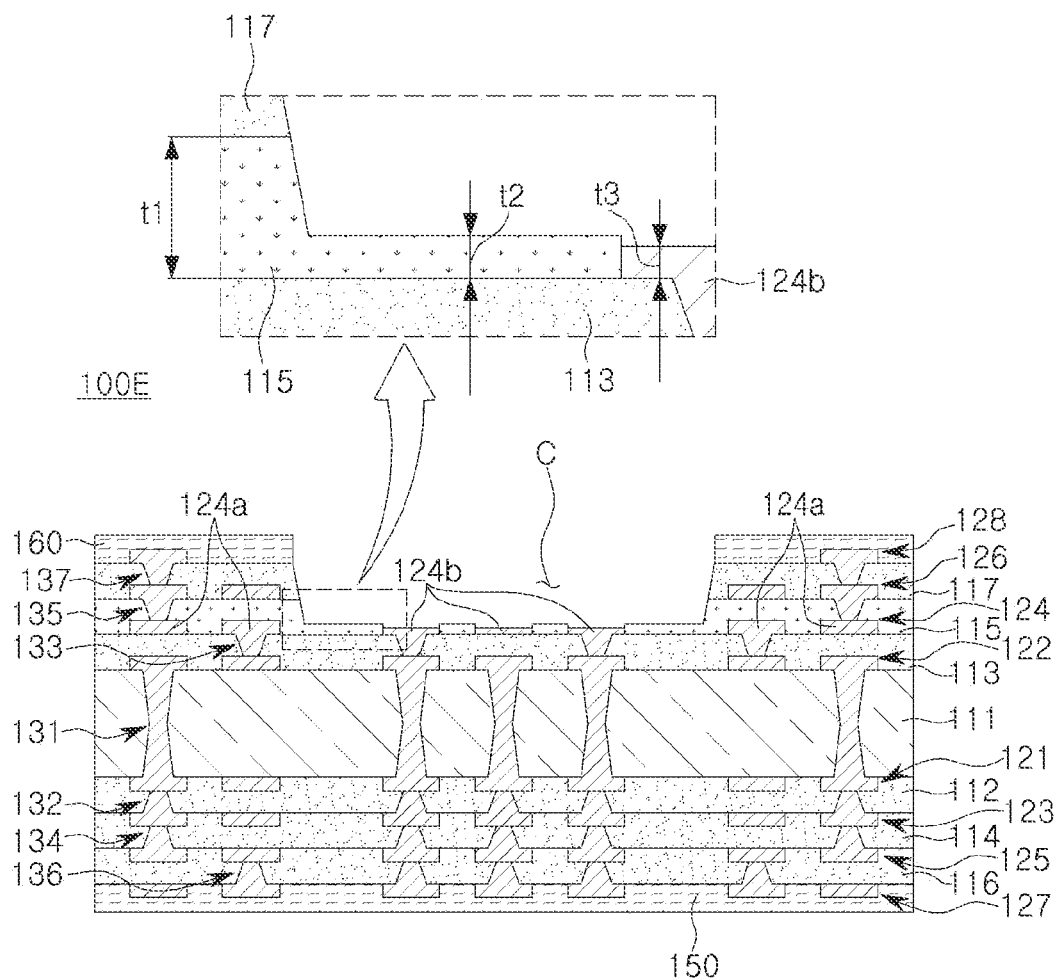
FIG. 11 is a cross-sectional view schematically illustrating another exemplary embodiment of a printed circuit board.

FIG. 11 is a cross-sectional view schematically illustrating another exemplary embodiment of a printed circuit board.

Referring to FIG. 11, the printed circuit board 100E according to another exemplary embodiment is different from the printed circuit board 100A according to an exemplary embodiment described above in that the second wiring pattern 124b may be recessed such that the upper surface thereof is lower than the exposed upper surface of the fifth insulating layer 115. Therefore, in the printed circuit board 100E according to another exemplary embodiment, when t1 denotes a thickness of a portion of the fifth insulating layer 115 covered by the seventh insulating layer 117, t2 denotes a thickness of a portion of the fifth insulating layer 115 exposed by the cavity C, and t3 denotes a thickness of the second wiring pattern 124b, $t1 > t2 > t3$ may be satisfied. However, taking into consideration a problem of overdissolution of copper (Cu) during soldering, it is more preferable that t3 is ½ or more of t2. The thickness of the second wiring pattern 124b may be less than a thickness of the first wiring pattern 124a. A lower surface of the second wiring pattern 124b may be coplanar with a lower surface of the fifth insulating layer 115.

The other details are substantially the same as described above, and the overlapping detailed description thereof will be omitted.

Figure 12:
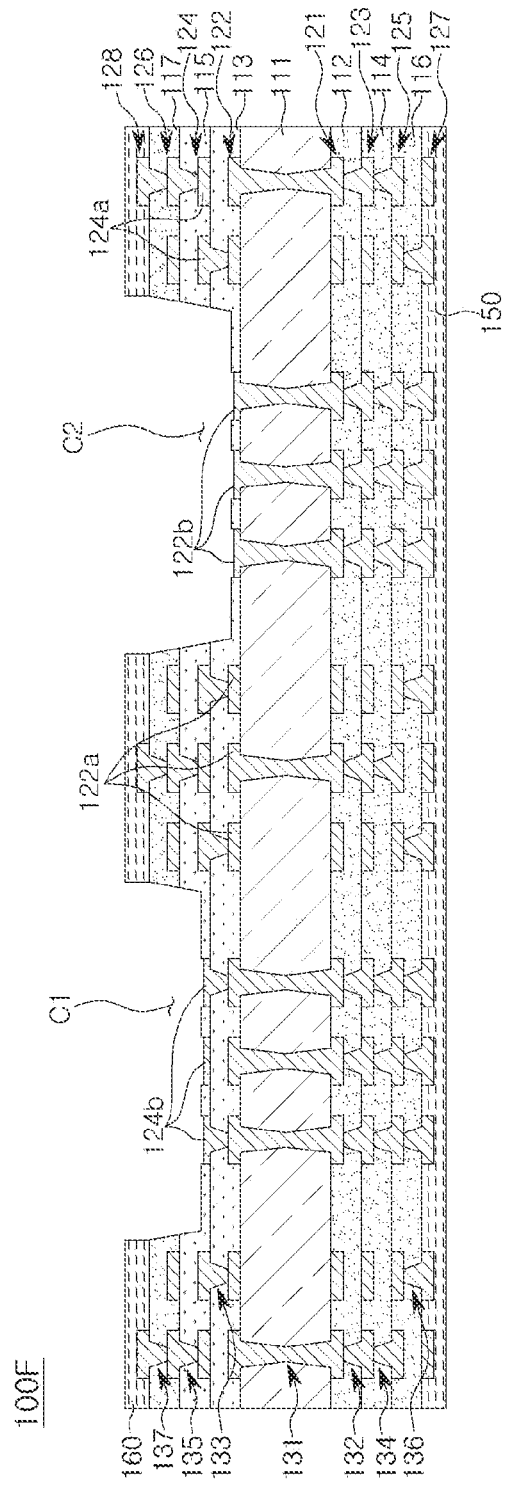
FIG. 12 is a cross-sectional view schematically illustrating another exemplary embodiment of a printed circuit board.

FIG. 12 is a cross-sectional view schematically illustrating another exemplary embodiment of a printed circuit board.

Referring to FIG. 12, the printed circuit board 100F according to another exemplary embodiment is different from the printed circuit board 100B according to another exemplary embodiment described above in that the second wiring pattern 124b may be recessed such that the upper surface thereof is lower than the exposed upper surface of the fifth insulating layer 115. Therefore, in the printed circuit board 100F according to another exemplary embodiment, a portion of the fifth insulating layer 115 covered by the seventh insulating layer 117 may be thicker than a portion of the fifth insulating layer 115 exposed by the first cavity C1, and the portion of the fifth insulating layer 115 exposed by the first cavity C1 may be thicker than the second wiring pattern 124b. The thickness of the second wiring pattern 124b may be less than a thickness of the first wiring pattern 124a. A lower surface of the second wiring pattern 124b may be coplanar with a lower surface of the fifth insulating layer 115. Also, the fourth wiring pattern 122b may be recessed such that the upper surface thereof is lower than the exposed upper surface of the third insulating layer 113. Therefore, in the printed circuit board 100F according to another exemplary embodiment, a portion of the third insulating layer 113 covered by the fifth insulating layer 115 may be thicker than a portion of the third insulating layer 113 exposed by the second cavity C2, and the portion of the third insulating layer 113 exposed by the second cavity C2 may be thicker than the fourth wiring pattern 122b. The thickness of the fourth wiring pattern 122b may be less than a thickness of the third wiring pattern 122a. A lower surface of the fourth wiring pattern 122b may be coplanar with a lower surface of the third insulating layer 113.

The other details are substantially the same as described above, and the overlapping detailed description thereof will be omitted.

Figure 13:
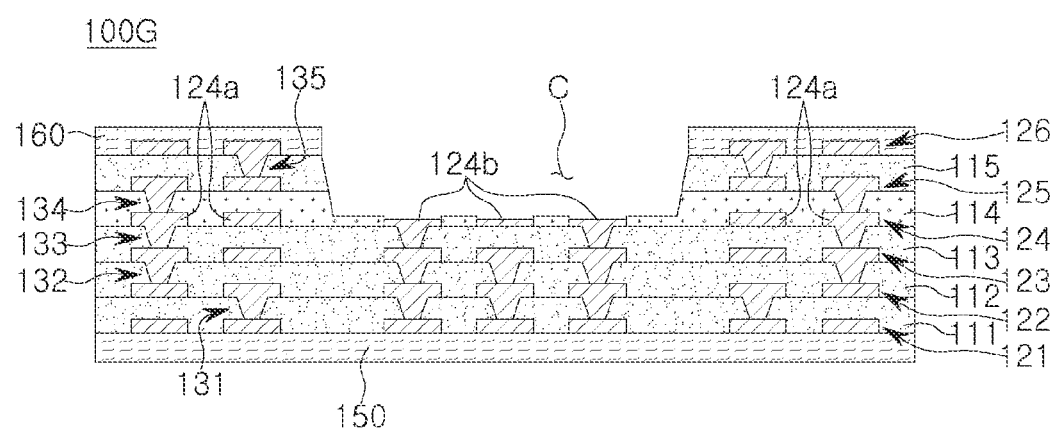
FIG. 13 is a cross-sectional view schematically illustrating another exemplary embodiment of a printed circuit board.

FIG. 13 is a cross-sectional view schematically illustrating another exemplary embodiment of a printed circuit board.

Referring to FIG. 13, the printed circuit board 100G according to another exemplary embodiment is different from the printed circuit board 100C according to another exemplary embodiment described above in that the second wiring pattern 124b may be recessed such that the upper surface thereof is lower than the exposed upper surface of the fourth insulating layer 114. Therefore, in the printed circuit board 100G according to another exemplary embodiment, a portion of the fourth insulating layer 114 covered by the fifth insulating layer 115 may be thicker than a portion of the fourth insulating layer 114 exposed by the cavity C, and the portion of the fourth insulating layer 114 exposed by the cavity C may be thicker than the second wiring pattern 124b. The thickness of the second wiring pattern 124b may be less than a thickness of the first wiring pattern 124a. A lower surface of the second wiring pattern 124b may be coplanar with a lower surface of the fifth insulating layer 115.

The other details are substantially the same as described above, and the overlapping detailed description thereof will be omitted.

Figure 14:
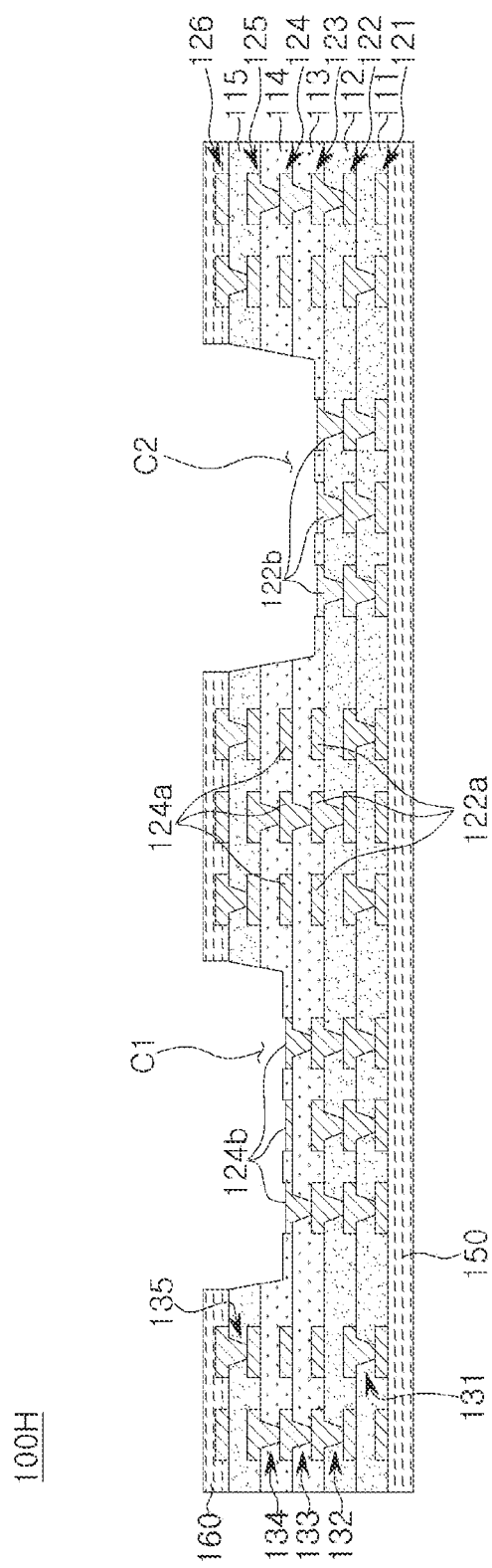
FIG. 14 is a cross-sectional view schematically illustrating another exemplary embodiment of a printed circuit board.

FIG. 14 is a cross-sectional view schematically illustrating another exemplary embodiment of a printed circuit board.

Referring to FIG. 14, the printed circuit board 100H according to another exemplary embodiment is different from the printed circuit board 100D according to another exemplary embodiment described above in that the second wiring pattern 124b may be recessed such that the upper surface thereof is lower than the exposed upper surface of the fourth insulating layer 114. Therefore, in the printed circuit board 100H according to another exemplary embodiment, a portion of the fourth insulating layer 114 covered by the fifth insulating layer 115 may be thicker than a portion of the fourth insulating layer 114 exposed by the first cavity C1, and the portion of the fourth insulating layer 114 exposed by the first cavity C1 may be thicker than the second wiring pattern 124b. The thickness of the second wiring pattern 124b may be less than a thickness of the first wiring pattern 124a. A lower surface of the second wiring pattern 124b may be coplanar with a lower surface of the fourth insulating layer 114. Also, the fourth wiring pattern 122b may be recessed such that the upper surface thereof is lower than the exposed upper surface of the third insulating layer 113. Therefore, in the printed circuit board 100H according to another exemplary embodiment, a portion of the third insulating layer 113 covered by the fourth insulating layer 114 may be thicker than a portion of the third insulating layer 113 exposed by the second cavity C2, and the portion of the third insulating layer 113 exposed by the second cavity C2 may be thicker than the fourth wiring pattern 122b. The thickness of the fourth wiring pattern 122b may be less than a thickness of the third wiring pattern 122a. A lower surface of the fourth wiring pattern 122b may be coplanar with a lower surface of the third insulating layer 113.

The other details are substantially the same as described above, and the overlapping detailed description thereof will be omitted.

As set forth above, according to the exemplary embodiments in the present disclosure, the printed circuit board having a cavity structure can be provided such that the printed circuit board can be thin even when an electronic component is mounted thereon.

Further, the printed circuit board having a wiring pattern exposed by a cavity can be provided such that an electronic component can be effectively mounted on the printed circuit board.

In addition, the printed circuit board capable of preventing a delamination defect of the wiring pattern exposed by the cavity can be provided.

While exemplary embodiments have been shown and described above, it will be apparent to those skilled in the art that modifications and variations could be made without departing from the scope of the present invention as defined by the appended claims.

What is claimed is:
1. A printed circuit board comprising:
a first insulating layer;
a first wiring layer at least partially buried in the first insulating layer;
a second insulating layer disposed on an upper surface of the first insulating layer;
a second wiring layer at least partially buried in the second insulating layer; and
a cavity penetrating through the second insulating layer and a portion of the first insulating layer and exposing a portion of the upper surface of the first insulating layer as a bottom surface of the cavity, wherein the first wiring layer includes a wiring pattern at least partially exposed from the first insulating layer by the cavity, an upper surface of the wiring pattern is arranged above, and has a step structure with, the upper surface of the first insulating layer exposed by the cavity, a lower surface of the wiring pattern is coplanar with a lower surface of the first insulating layer, and the wiring pattern extends continuously from the lower surface of the wiring pattern to the upper surface of the wiring pattern.

2. The printed circuit board of claim 1, wherein the wiring pattern protrudes such that the upper surface thereof is higher than the exposed upper surface of the first insulating layer.

3. The printed circuit board of claim 2, wherein t1>t3>t2, in which t1 is a thickness of a portion of the first insulating layer covered by the second insulating layer, t2 is a thickness of a portion of the first insulating layer exposed by the cavity, and t3 is a thickness of the wiring pattern.

4. The printed circuit board of claim 1, wherein the wiring pattern is recessed, such that the upper surface thereof is lower than the exposed upper surface of the first insulating layer.

5. The printed circuit board of claim 4, wherein t1>t2>t3, in which t1 is a thickness of a portion of the first insulating layer covered by the second insulating layer, t2 is a thickness of a portion of the first insulating layer exposed by the cavity, and t3 is a thickness of the wiring pattern.

6. The printed circuit board of claim 4, wherein a thickness of the wiring pattern of the first wiring layer exposed by the cavity is less than a thickness of another wiring pattern of the first wiring layer covered by the second insulating layer.

7. The printed circuit board of claim 1, wherein the first insulating layer contains an insulating resin and an inorganic or organic filler without a glass fiber, and the second insulating layer contains a glass fiber and prepreg (PPG) as an insulating resin.

8. The printed circuit board of claim 1, further comprising a first wiring via layer penetrating through the first insulating layer and connecting the first and second wiring layers at least partially to each other.

9. The printed circuit board of claim 8, further comprising:

a third wiring layer disposed on an upper surface of the second insulating layer;

a second wiring via layer penetrating through the second insulating layer and connecting the second and third wiring layers at least partially to each other; and a passivation layer disposed on the upper surface of the second insulating layer and at least partially covering the third wiring layer.

10. The printed circuit board of claim 9, further comprising:

a third insulating layer disposed on the lower surface of the first insulating layer;

a fourth wiring layer at least partially buried in the third insulating layer; and a third wiring via layer penetrating through the third insulating layer and connecting the first and fourth wiring layers at least partially to each other.

11. The printed circuit board of claim 1, wherein the first insulating layer has a smaller modulus than the second insulating layer.

12. A printed circuit board comprising:
a first insulating layer;

a second insulating layer disposed on an upper surface of the first insulating layer;

a first cavity penetrating through a portion of the second insulating layer and having a portion of an upper surface of the second insulating layer as a bottom surface of the first cavity;

a second cavity penetrating through the second insulating layer and a portion of the first insulating layer and having a portion of the upper surface of the first insulating layer as a bottom surface of the second cavity;

a first wiring layer buried in a lower portion of the first insulating layer and at least partially exposed from the first insulating layer by the second cavity; and a second wiring layer buried in a lower portion of the second insulating layer and at least partially exposed from the second insulating layer by the first cavity, wherein the second cavity is deeper than the first cavity, and wherein the first wiring layer extends continuously from a lower surface of an at least partially exposed portion of the first wiring layer to an upper surface, arranged above the first insulating layer, of the at least partially exposed portion of the first wiring layer, or the second wiring layer extends continuously from a lower surface of an at least partially exposed portion of the second wiring layer to an upper surface, arranged above the second insulating layer, of the at least partially exposed portion of the second wiring layer.

13. The printed circuit board of claim 12, wherein the upper surface of the at least partially exposed portion of the first wiring layer has a step structure with the bottom surface of the second cavity, and the lower surface of the at least partially exposed portion of the first wiring layer is coplanar with a lower surface of the first insulating layer, the upper surface of the at least partially exposed portion of the second wiring layer has a step structure with the bottom surface of the first cavity, and the lower surface of the at least partially exposed portion of the second wiring layer is coplanar with a lower surface of the second insulating layer.

14. The printed circuit board of claim 12, wherein the first and second insulating layers contain an insulating resin and an inorganic or organic filler without a glass fiber.

15. The printed circuit board of claim 12, further comprising:

a third insulating layer disposed on the upper surface of the second insulating layer;

a third wiring layer buried in a lower portion of the third insulating layer; and a fourth wiring layer disposed on an upper surface of the third insulating layer, wherein each of the first and second cavities further penetrates through the third insulating layer.

16. The printed circuit board of claim 15, further comprising:

a fourth insulating layer disposed on a lower surface of the first insulating layer; and a fifth wiring layer buried in a lower portion of the fourth insulating layer.

17. The printed circuit board of claim 15, wherein the third insulating layer has a greater modulus than the first insulating layer and the second insulating layer.

18. A printed circuit board comprising:
a first insulating layer;
a first wiring layer at least partially buried in the first insulating layer;

a second insulating layer disposed on an upper surface of the first insulating layer;

a second wiring layer at least partially buried in the second insulating layer;

a via disposed in the first insulating layer and connecting the first wiring layer and the second wiring layer to each other; and a cavity penetrating through the second insulating layer and a portion of the first insulating layer and exposing a portion of the upper surface of the first insulating layer as a bottom surface of the cavity, wherein the first wiring layer includes a wiring pattern at least partially exposed from the first insulating layer by the cavity, an upper surface of the wiring pattern is arranged above, and has a step structure with, the upper surface of the first insulating layer exposed by the cavity, a width of the via increases in a direction from the first wiring layer to the second wiring layer, and the wiring pattern extends continuously from a lower surface of the wiring pattern to the upper surface of the wiring pattern.

19. The printed circuit board of claim 18, wherein t1>t3>t2, in which t1 is a thickness of a portion of the first insulating layer covered by the second insulating layer, t2 is a thickness of a portion of the first insulating layer exposed by the cavity, and t3 is a thickness of the wiring pattern.

20. The printed circuit board of claim 18, wherein t1>t2>t3, in which t1 is a thickness of a portion of the first insulating layer covered by the second insulating layer, t2 is a thickness of a portion of the first insulating layer exposed by the cavity, and t3 is a thickness of the wiring pattern.

21. The printed circuit board of claim 18, wherein among the first insulating layer and the second insulating layer, only the second insulating layer contains a glass fiber.

22. The printed circuit board of claim 18, wherein the first insulating layer has a smaller modulus than the second insulating layer.

* * * * *